(12) United States Patent
Chern

(10) Patent No.: US 11,088,155 B2
(45) Date of Patent: Aug. 10, 2021

(54) METHOD FOR FABRICATING SPLIT-GATE NON-VOLATILE MEMORY

(71) Applicant: Nexchip Semiconductor Co., LTD, Anhui (CN)

(72) Inventor: Geeng-Chuan Chern, Anhui (CN)

(73) Assignee: Nexchip Semiconductor Co., LTD, Hefei (CN)

( * ) Notice: Subject to any disclaimer, the term of this patent is extended or adjusted under 35 U.S.C. 154(b) by 35 days.

(21) Appl. No.: 16/822,029

(22) Filed: Mar. 18, 2020

(65) Prior Publication Data
US 2020/0251481 A1    Aug. 6, 2020

Related U.S. Application Data

(63) Continuation of application No. 16/199,189, filed on Nov. 25, 2018, now Pat. No. 10,636,801.

(51) Int. Cl.
| | |
|---|---|
| *H01L 29/792* | (2006.01) |
| *H01L 27/11521* | (2017.01) |
| *H01L 27/11519* | (2017.01) |
| *H01L 29/423* | (2006.01) |
| *H01L 21/762* | (2006.01) |
| *H01L 21/768* | (2006.01) |
| *H01L 21/28* | (2006.01) |

(52) U.S. Cl.
CPC .. *H01L 27/11521* (2013.01); *H01L 21/76224* (2013.01); *H01L 21/76897* (2013.01); *H01L 27/11519* (2013.01); *H01L 29/40114* (2019.08); *H01L 29/42328* (2013.01)

(58) Field of Classification Search
CPC ............ H01L 29/66833; H01L 29/792; H01L 29/40117; H01L 29/66825; H01L 29/4234; H01L 27/11519; H01L 29/42344; H01L 21/76224; H01L 29/42332; H01L 27/11563; H01L 27/11521; H01L 29/42324; H01L 29/788; H01L 21/76838; H01L 21/76885; H01L 21/76897; H01L 21/823481; H01L 29/4232
USPC ........................................................ 257/324
See application file for complete search history.

(56) References Cited

U.S. PATENT DOCUMENTS

2017/0337980 A1*  11/2017  Guo ..................... G11C 7/18
2019/0088667 A1*  3/2019  Yeh ................... H01L 29/40114

* cited by examiner

*Primary Examiner* — Theresa T Doan

(57) ABSTRACT

The present disclosure provides a method for fabricating split-gate non-volatile memory. The method comprises the following: 1) preparing a semiconductor substrate by forming at least one shallow trench isolation structure in the semiconductor substrate to isolate at least one active region in the semiconductor substrate; 2) forming at least one word line on the semiconductor substrate; 3) forming at least one source and at least one drain in the semiconductor substrate, and forming at least one floating gate on a sidewall of the word line on a side close to the source; 4) removing part of the word line by adopting an etching process; 5) forming a tunneling dielectric layer and an erasing gate at the top portion of the floating gate; and 6) forming a conductive plug on the drain and forming at least one metal bit line on the conductive plug.

10 Claims, 13 Drawing Sheets

METHOD FOR FABRICATING SPLIT-GATE NON-VOLATILE MEMORY

CROSS REFERENCE TO RELATED APPLICATIONS

This application claims is a continuation application claiming priority to U.S. application Ser. No. 16/199,189, filed on Nov. 25, 2018, which claims the priority to Chinese Patent Application No. CN 2018107962778, filed with CNIPA on Jul. 19, 2018, both of which are hereby incorporated by reference in their entireties, including any appendices or attachments thereof, for all purpose.

BACKGROUND OF THE PRESENT DISCLOSURE

Field of Disclosure

The present disclosure relates to the technical field of semiconductors, in particular to a method for fabricating split-gate non-volatile memory.

Description of Related Arts

In most of the existing non-volatile memories that implement inter-poly tunneling for erasing, the tunneling efficiency between a floating gate and an erasing gate is limited. In order to facilitate implementing quick erasing under a situation of lower voltage, the thickness of a tunneling dielectric layer between the floating gate and the erasing gate is generally reduced. However, reducing the thickness of the tunneling dielectric layer has the risk of causing leakage current, especially after programming/erasing endurance cycles due to Trap Assisted Tunneling (TAT) effect. Thus, charges stored in the floating gate leak into the erasing gate, consequently resulting in the problem of poor data retention.

SUMMARY OF THE PRESENT DISCLOSURE

In view of the above-mentioned disadvantages of the prior art, the purpose of the present disclosure is to provide a fabrication method of split-gate non-volatile memory, which are used for solving the problems that, since the thickness of the tunneling dielectric layer in the split-gate memory in the prior art is relatively small in order to guarantee erasing, current leakage is easily caused and consequently the problem of poor data retention of the memory is caused.

In order to realize the above-mentioned purpose and other related purposes, the present disclosure provides a method for fabricating a split-gate non-volatile memory. The method for fabricating the split-gate non-volatile memory comprises: 1) preparing a semiconductor substrate by forming at least one shallow trench isolation structure in the semiconductor substrate, wherein the shallow trench isolation structure isolates at least one spaced active region in the semiconductor substrate; 2) forming at least one spaced word line on the semiconductor substrate; 3) forming at least one source and at least one drain in the semiconductor substrate, and forming at least one floating gate on a sidewall of the word line on a side close to the source, wherein the source and the drain are respectively located on two opposite sides of the word line, a cross section width of the floating gate gradually decreases from a bottom portion to a top portion such that a portion of the top portion of the floating gate that contacts with the word line presents as a sharp tip edge; 4) removing part of the word line by adopting an etching process such that the sharp tip edge of the top portion of the floating gate is higher than an upper edge of a top surface of the word line; 5) forming a tunneling dielectric layer and an erasing gate at the top portion of the floating gate, wherein the tunneling dielectric layer at least covers part of the sharp tip edge of the top portion of the floating gate, and the erasing gate is located on an upper surface of the tunneling dielectric layer; and 6) forming at least one conductive plug on the drain and forming at least one metal bit line on the conductive plug, wherein the metal bit line is electrically connected to the drain through the conductive plug.

Preferably, in operation 5), the tunneling dielectric layer at least covers part of an upper surface of the word line.

Preferably, in operation 4), the thickness of the word line formed by adopting the etching process is in a range of 10 nm-50 nm.

Preferably, operation 2) comprises the following: 2-1) sequentially forming a first gate dielectric layer, a first polycrystalline silicon layer and an insulating layer which are stacked from bottom to top on the semiconductor substrate; 2-2) etching the insulating layer and the first polycrystalline silicon layer to form a plurality of spaced word line conductive layers and a top insulating layer located on an upper surface of the word line conductive layers; 2-3) forming a sidewall spacer dielectric layer on the exposed first gate dielectric layer, sidewalls of the word line conductive layers and a sidewall and an upper surface of the top insulating layer; and 2-4) etching the sidewall spacer dielectric layer and the first gate dielectric layer to form a stacked structure comprising a bottom dielectric layer, the word line conductive layers and the top insulating layer which are sequentially stacked from bottom to top, and word line sidewall spacers located on both sides of the stacked structure.

Preferably, operation 3) comprises the following: 3-1) forming a second gate dielectric layer on a surface of the exposed semiconductor substrate; 3-2) forming a second polycrystalline silicon layer on a surface of the structure obtained in operation 3-1), the second polycrystalline silicon layer covers a surface of the second gate dielectric layer and the sidewall and the upper surface of the word line; 3-3) etching the second polycrystalline silicon layer to form at least one polycrystalline silicon sidewall spacer on outer walls of the word line sidewall spacers; 3-4) performing ion implantation in the semiconductor substrate to form the source and the drain in the semiconductor substrate; and 3-5) removing the polycrystalline silicon sidewall spacer of the word line and the second gate dielectric layer on a side close to the drain, and removing part of the polycrystalline silicon sidewall spacer of the word line on a side close to the source and in a region above the shallow trench isolation structure, the reserved polycrystalline silicon sidewall spacer and the reserved second gate dielectric layer below the reserved polycrystalline silicon sidewall spacer form the floating gate.

Preferably, after operation 3-5), the method further comprises the following operation: removing the second gate dielectric layer above the drain and the word line sidewall spacers on a side close to the drain.

Preferably, in operation 5), the tunneling dielectric layer at least covers part of the upper surface of the word line.

Preferably, in operation 5), after the tunneling dielectric layer and the erasing gate are formed, the method further comprises the following: forming a sidewall spacer on a sidewall of the erasing gate, a sidewall of the floating gate and a sidewall of the stacked structure close to the drain; and forming a heavily doped region in the source and the drain according to the sidewall spacer, and forming a lightly doped diffusion region on a periphery of the heavily doped region.

Preferably, in operation 5), after the heavily doped region and the lightly doped diffusion region are formed, the method further comprises the following: forming a silicide barrier layer on part of an upper surface of the erasing gate, a surface of the sidewall spacer of the erasing gate on a side close to the source, a surface of the sidewall spacer located on the sidewall of the floating gate and an upper surface of the source; and forming a self-aligned silicide layer on an upper surface of the exposed erasing gate, and an upper surface of the drain.

Preferably, the semiconductor substrate comprises a substrate of a first doping type, the first polycrystalline silicon layer comprises a polycrystalline silicone layer of a second doping type, the second polycrystalline silicon layer comprises a polycrystalline silicon layer of the second doping type, the source and the drain both are regions of the second doping type, the erasing gate comprises a polycrystalline silicon layer of the second doping type, the heavily doped region and the lightly doped diffusion region both are regions of the second doping type; and the first doping type is different from the second doping type.

Preferably, operation 5) comprises the following: 5-1) forming a tunneling dielectric material layer on a surface of the structure obtained in operation 4), wherein the tunneling dielectric material layer covers the exposed semiconductor substrate, the word line and the floating gate; 5-2) forming a third polycrystalline silicon layer on the tunneling dielectric material layer; and 5-3) etching the third polycrystalline silicon layer and the tunneling dielectric material layer to form the tunneling dielectric layer and the erasing gate.

Preferably, in operation 6), before the conductive plug is formed, the method further comprises the following: forming an interlayer dielectric layer on a surface of the structure obtained in operation 5); and forming a connecting via in the interlayer dielectric layer, wherein the connecting via exposes the drain.

Preferably, in operation 6), a conductive material layer is filled into the connecting via to form the conductive plug; and the metal bit line is formed on the interlayer dielectric layer.

As described above, the fabrication method thereof provided by the present disclosure have the following beneficial effects: by designing the top portion of the floating gate to be the sharp tip edge, the FN tunneling effect between the floating gate and the erasing gate can be obviously increased; since the top portion of the floating gate is the sharp tip edge, the thickness of the tunneling dielectric layer between the erasing gate and the floating gate can be increased, thus leakage current is avoided and the split-gate non-volatile memory can have better data retention.

BRIEF DESCRIPTION OF THE DRAWINGS

FIG. 3 to FIG. 4 illustrate structural schematic views of a structure obtained in operation 1) of the method for fabricating the split-gate non-volatile memory provided in embodiment 1 of the present disclosure, wherein FIG. 3 illustrates a sectional structural schematic view along AA' direction in FIG. 2, and FIG. 4 illustrates a sectional structural schematic view along BB' direction in FIG. 2.

FIG. 5 to FIG. 11 illustrate schematic views of a structure obtained in operation 2) of the method for fabricating the split-gate non-volatile memory provided in embodiment 1 of the present disclosure, wherein FIG. 5 illustrates a sectional structural schematic view of a structure obtained after sequentially forming a first gate dielectric layer, a first polycrystalline silicon layer and an insulating layer which are stacked from bottom to top on a semiconductor substrate, FIG. 6 illustrates a sectional structural schematic view along AA' direction in FIG. 2, FIG. 7 illustrates a sectional structural schematic view along BB' direction in FIG. 2, FIG. 8 illustrates a sectional structural schematic view of a structure obtained after etching to form a word line conductive layer and a top insulating layer along AA' direction in FIG. 2, FIG. 9 illustrates a sectional structural schematic view of a structure obtained after forming a sidewall spacer dielectric layer along AA' direction in FIG. 2, FIG. 10 illustrates a sectional structural schematic view along AA' direction in FIG. 2, and FIG. 11 illustrates a sectional structural schematic view along BB' direction in FIG. 2.

FIG. 12 to FIG. 18 illustrate schematic views of a structure obtained in operation 3) of the method for fabricating the split-gate non-volatile memory provided in embodiment 1 of the present disclosure, wherein FIG. 12 illustrates a sectional structural schematic view of a structure obtained after forming a second gate dielectric layer and a second polycrystalline silicon layer on a surface of the structure obtained in operation 2) along AA' direction in FIG. 2, FIG. 13 illustrates a sectional structural schematic view along AA' direction in FIG. 2, FIG. 14 illustrates a sectional structural schematic view along BB' direction in FIG. 2, FIG. 15 and FIG. 16 respectively illustrate sectional structural schematic views after forming a source and a drain along AA' direction and BB' direction in FIG. 2, FIG. 17 illustrates a sectional structural schematic view along AA' direction in FIG. 2, and FIG. 18 illustrates a sectional structural schematic view along BB' direction in FIG. 2.

FIG. 20 to FIG. 24 illustrate schematic views of a structure obtained in operation 3) of the method for fabricating the split-gate non-volatile memory provided in embodiment 1 of the present disclosure, wherein FIG. 20 illustrates a sectional structural schematic view along AA' direction in FIG. 2, FIG. 21 illustrates a sectional structural schematic view along BB' direction in FIG. 2, FIG. 22 illustrates a sectional structural schematic view of a structure obtained after etching a third polycrystalline silicon layer and a tunneling dielectric material layer according to a third patterned photoresist layer, FIG. 23 illustrates a sectional structural schematic view along AA' direction in FIG. 2, and FIG. 24 illustrates a sectional structural schematic view along BB' direction in FIG. 2.

FIG. 26 to FIG. 27 illustrate sectional schematic views of a structure obtained in operation 6) of the method for fabricating the split-gate non-volatile memory provided in embodiment 1 of the present disclosure, wherein FIG. 26 illustrates a sectional structural schematic view along AA' direction in FIG. 2, and FIG. 27 illustrates a sectional structural schematic view along BB' direction in FIG. 2.

DESCRIPTION OF COMPONENT NUMBERS

Figure 1:
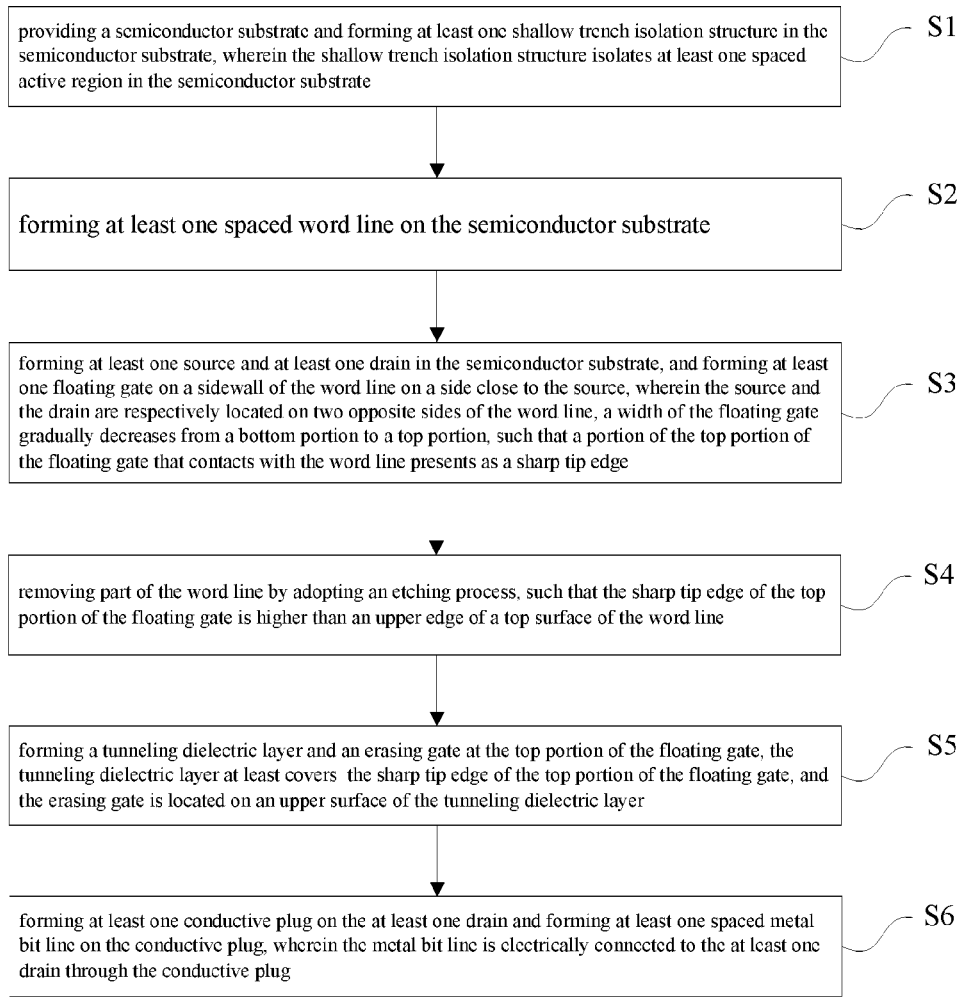
FIG. 1 illustrates a flowchart of a method for fabricating a split-gate non-volatile memory provided in embodiment 1 of the present disclosure.

10 Semiconductor substrate
11 Shallow trench isolation structure
12 Active region
13 Word line
131 First gate dielectric layer
132 First polycrystalline silicon layer
133 Insulating layer
134 Stacked structure
1341 Word line conductive layer
1342 Top insulating layer
1343 Bottom dielectric layer
135 Word line sidewall spacer
1351 Sidewall spacer dielectric layer
14 Source
141 Source line
15 Drain
16 Floating gate
161 Second gate dielectric layer
162 Second polycrystalline silicon layer
163 Polycrystalline silicon sidewall spacer
164 Floating gate dielectric layer
165 Floating gate conductive layer
166 Sharp tip edge
17 Tunneling dielectric layer
171 Tunneling dielectric material layer
18 Erasing gate
181 Third polycrystalline silicon layer
19 Sidewall spacer
20 Heavily doped region
21 Lightly doped diffusion region
22 Silicide barrier layer
23 Self-aligned silicide layer
24 Interlayer dielectric layer
25 Conductive plug
26 First patterned photoresist layer
27 Second patterned photoresist layer
28 Third patterned photoresist layer
29 Metal bit line
α First angle
d Distance from sharp tip edge of top portion of floating gate to top surface of word line
S1-S6 Operations

DETAILED DESCRIPTION OF THE PREFERRED EMBODIMENTS

The implementation modes of the present disclosure will be described below through specific examples. One skilled in the art can easily understand other advantages and effects of the present disclosure according to content disclosed in the description. The present disclosure may also be implemented or applied through other different specific implementation modes. Various modifications or variations may be made to all details in the description based on different points of view and applications without departing from the spirit of the present disclosure.

Referring to FIGS. 2 to 30, it needs to be stated that the drawings provided in this embodiment are just used for schematically describing the basic concept of the present disclosure, thus only illustrate components related to the present disclosure and are not drawn according to the numbers, shapes and sizes of components during actual implementation, the configuration, number and scale of each component during actual implementation thereof may be freely changed, and the component layout configuration thereof may be more complex.

Embodiment 1

Referring to FIG. 1, the present disclosure provides a method for fabricating a split-gate non-volatile memory. The method for fabricating the split-gate non-volatile memory comprises:

1) preparing a semiconductor substrate by forming at least one shallow trench isolation structure in the semiconductor substrate, wherein the shallow trench isolation structure isolates at least one spaced active region in the semiconductor substrate;

2) forming at least one spaced word line on the semiconductor substrate;

3) forming at least one source and at least one drain in the semiconductor substrate, and forming at least one floating gate on a sidewall of the word line on a side close to the source, wherein the source and the drain are respectively located on two opposite sides of the word line, a cross section width of the floating gate gradually decreases from a bottom portion to a top portion such that a portion of the top portion of the floating gate that contacts with the word line presents as a sharp tip edge;

4) removing part of the word line by adopting an etching process such that the sharp tip edge of the top portion of the floating gate is higher than an upper edge of a top surface of the word line;

5) forming a tunneling dielectric layer and an erasing gate at the top portion of the floating gate, wherein the tunneling dielectric layer at least covers part of the sharp tip edge of the top portion of the floating gate, and the erasing gate is located on an upper surface of the tunneling dielectric layer; and 6) forming at least one conductive plug respectively on the at least one drain and forming at least one metal bit line respectively on the conductive plug, wherein the metal bit line is respectively electrically connected to the at least one drain through the conductive plug.

Figure 2:
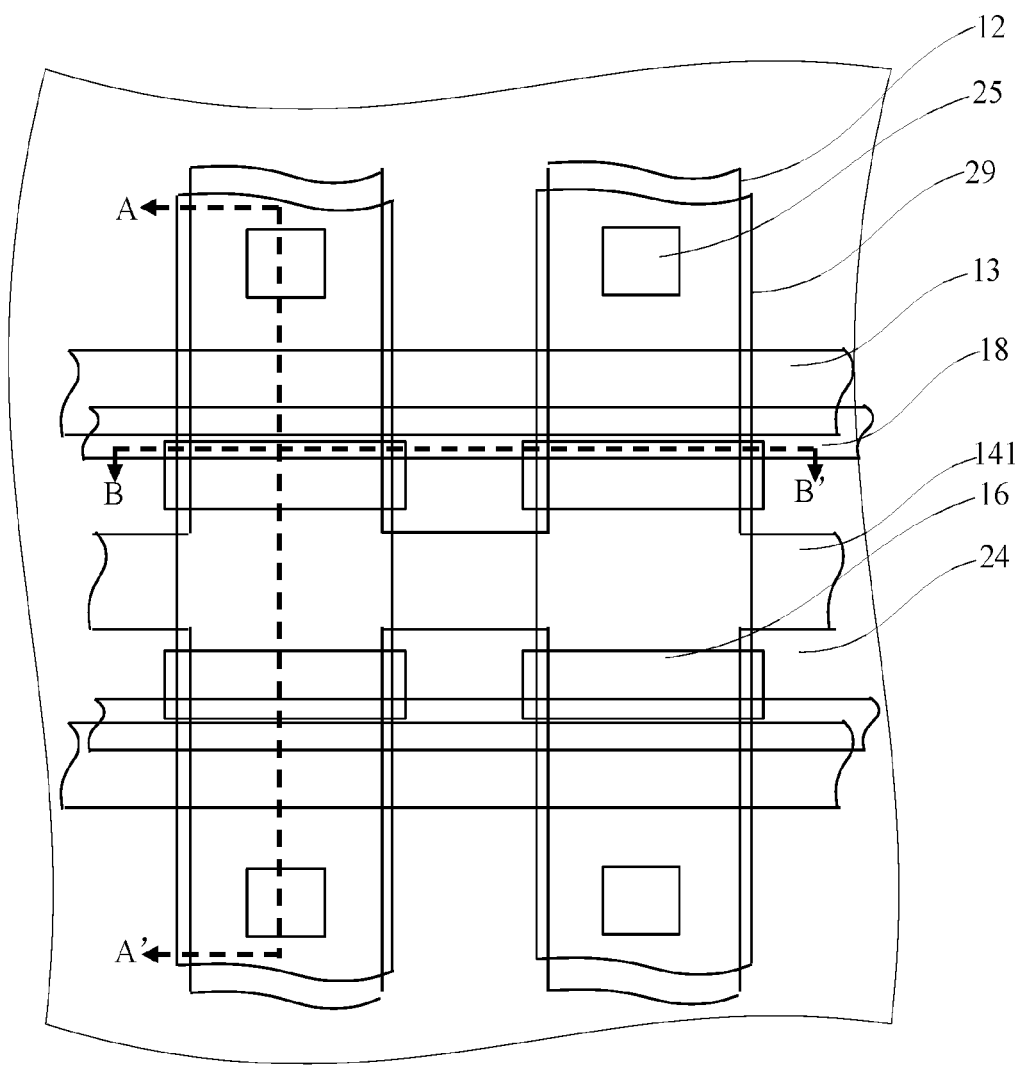
FIG. 2 illustrates a top structural schematic view of a split-gate non-volatile memory provided by the present disclosure.

A top view of the split-gate non-volatile memory fabricated by adopting the method for fabricating the split-gate non-volatile memory provided by the present disclosure is as illustrated in FIG. 2, the split-gate non-volatile memory at least comprises: a metal bit line 29, a word line 13, a source line 141, a floating gate 16, an erasing gate 18, an active region 12 and a conductive plug 25. FIG. 2 further illustrates two cross section directions by using dashed lines, including a first dashed line from A to A' and a second dashed line from B to B'.

Figure 3:
Figure 4:
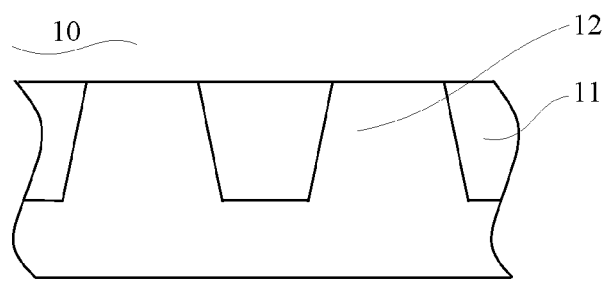

In operation 1), referring to operation S1 in FIG. 1 and FIG. 3 to FIG. 4, a semiconductor substrate 10 is provided and at least one shallow trench isolation structure 11 is formed in the semiconductor substrate 10, the shallow trench isolation structure 11 isolates at least one spaced active region 12 in the semiconductor substrate.

As an example, a material of the semiconductor substrate 10 may include, but is not limited to, a monocrystalline or polycrystalline semiconductor material, the semiconductor substrate 10 may further comprise an intrinsic monocrystalline silicon substrate or doped silicon substrate; preferably, the semiconductor substrate 10 comprises a substrate of a first doping type, the first doping type may be P-type and may also be N-type, and in this embodiment, the situation that the first doping type is P-type is taken as an example, i.e., in this embodiment, the situation that the semiconductor substrate 10 is a P-type substrate is only taken as an example.

As an example, the shallow trench isolation structure 11 may be formed by forming trenches (not shown) in the semiconductor substrate 10 and then filling an isolation material into the trenches. A material of the shallow trench isolation structure 11 may comprise silicon nitride, silicon oxide, silicon oxynitride or the like, and preferably, in this embodiment, the material of the shallow trench isolation structure 11 comprises silicon oxide. A shape of a cross section of the shallow trench isolation structure 11 may be configured according to actual needs, FIG. 4 takes the situation that the shape of the cross section of the shallow trench isolation structure 11 comprises an inverted trapezoid shape as an example; of course, in other examples, the shape of the cross section of the shallow trench isolation structure 11 may also be a U shape, etc.

It needs to be stated that, the specific number of the active region 12 isolated by the shallow trench isolation structure 11 in the semiconductor substrate 10 may be configured according to actual needs and is not limited herein. FIG. 3 only takes the situation that two active regions 12 are illustrated in the semiconductor substrate 10 as an example.

It needs to be further stated that the plurality of active regions 12 may be spaced in parallel and may also be freely arranged according to actual needs.

In operation 2), referring to operation S2 in FIG. 1 and FIG. 5 to FIG. 11, at least one spaced word line 13 is formed on the semiconductor substrate 10.

Figure 5:
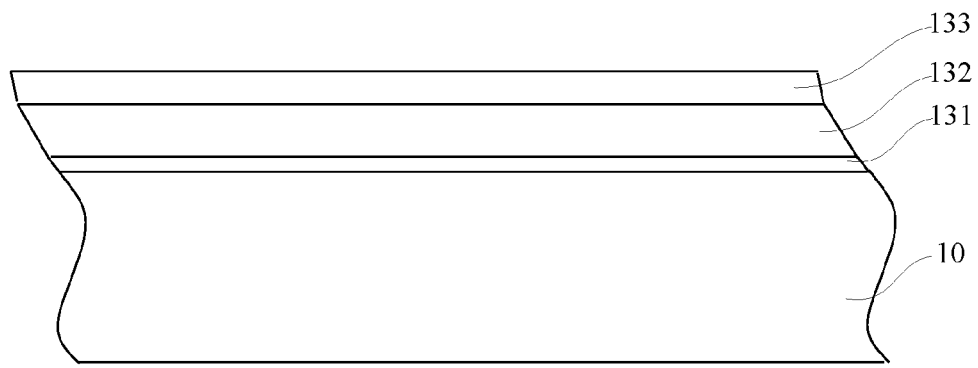
Figure 9:
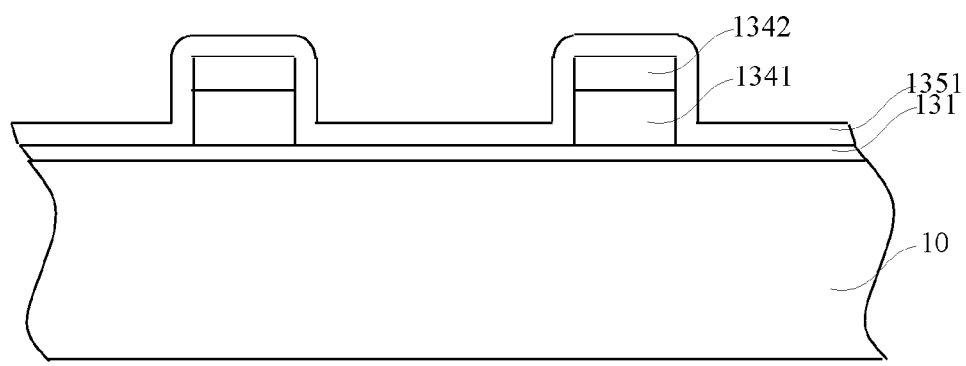
Figure 10:
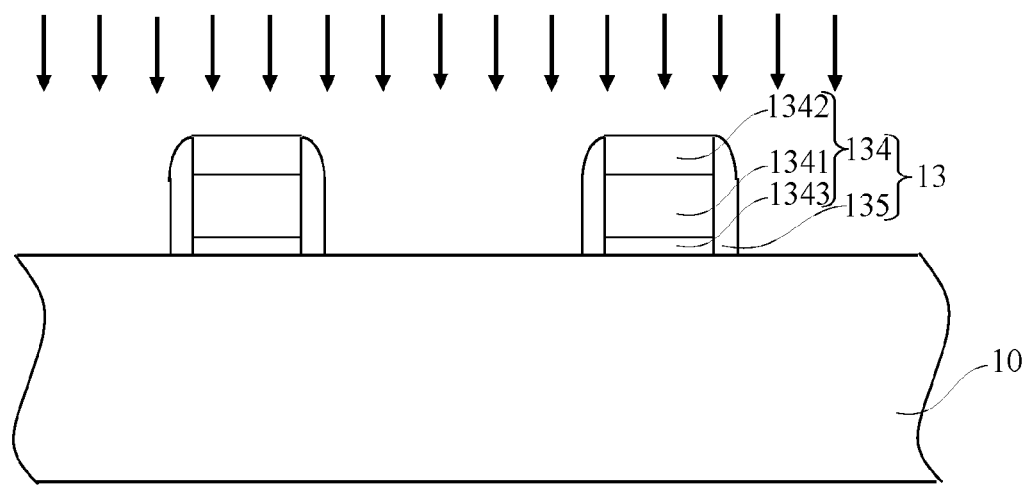
Figure 11:
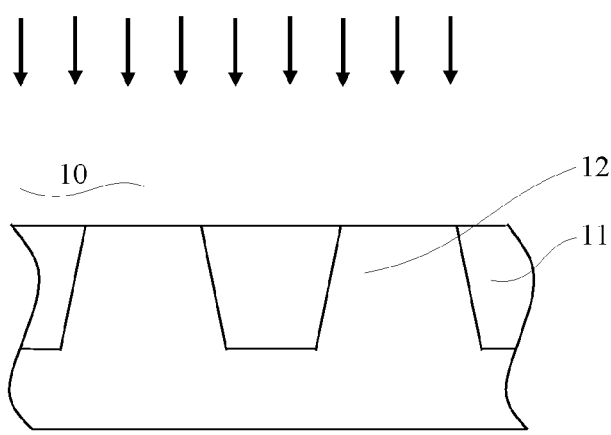

As an example, forming the at least one spaced word line 13 on the semiconductor substrate 10 specifically comprises the following:

2-1) sequentially forming a first gate dielectric layer 131, a first polycrystalline silicon layer 132 and an insulating layer 133 which are stacked from bottom to top on the semiconductor substrate 10, as illustrated in FIG. 5;

2-2) etching the insulating layer 133 and the first polycrystalline silicon layer 132 to form a plurality of spaced word line conductive layers 1341 and a top insulating layer 1342 located on an upper surface of the word line conductive layers 1341;

2-3) forming a sidewall spacer dielectric layer 1351 on the exposed first gate dielectric layer 131, sidewalls of the word line conductive layers 1341 and a sidewall and an upper surface of the top insulating layer 1342, i.e., the sidewall spacer dielectric layer 1351 covers the exposed first gate dielectric layer 131, the sidewalls of the word line conductive layers 1341 and the sidewall and the upper surface of the top insulating layer 1342, as illustrated in FIG. 9; and 2-4) etching the sidewall spacer dielectric layer 1351 and the first gate dielectric layer 131 to form a stacked structure 134 comprising a bottom dielectric layer 1343, the word line conductive layers 1341 and the top insulating layer 1342 which are sequentially stacked from bottom to top, and word line sidewall spacers 135 located on both sides of the stacked structure 134, as illustrated in FIG. 10 to FIG. 11.

As an example, in operation 2-1), a material of the first gate dielectric layer 131 may include, but is not limited to, silicon oxide, silicon oxynitride or the like; a thickness of the first gate dielectric layer 131 may be configured to actual needs, preferably, in this embodiment, the thickness of the first gate dielectric layer 131 may be in a range of 2 nm-18 nm; the first polycrystalline silicon layer 131 may be a polycrystalline silicon layer of a second doping type, i.e., the doping type of the first polycrystalline silicon layer 132 is different from the doping type of the semiconductor substrate 10; the second doping type may be P-type and may also be N-type, when the first doping type is P-type, the second doping type is N-type, and when the first doping type is N-type, the second doping type is P-type; a thickness of the first polycrystalline silicon layer 132 may be configured according to actual needs, preferably, in this embodiment, the thickness of the first polycrystalline silicon layer 132 may be in a range of 200 nm-500 nm; a material of the insulating layer 133 may include, but is not limited to, silicon oxide or silicon nitride, a thickness of the insulating layer 133 may be configured according to actual needs, preferably, in this embodiment, the thickness of the insulating layer 133 may be in a range of 50 nm-200 nm.

Figure 6:
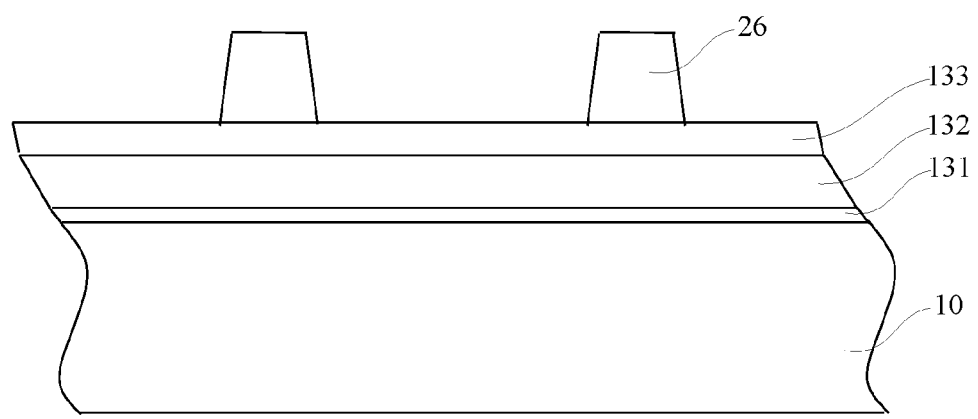
Figure 7:
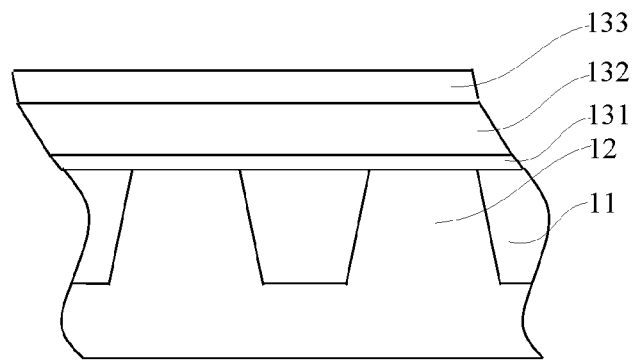
Figure 8:
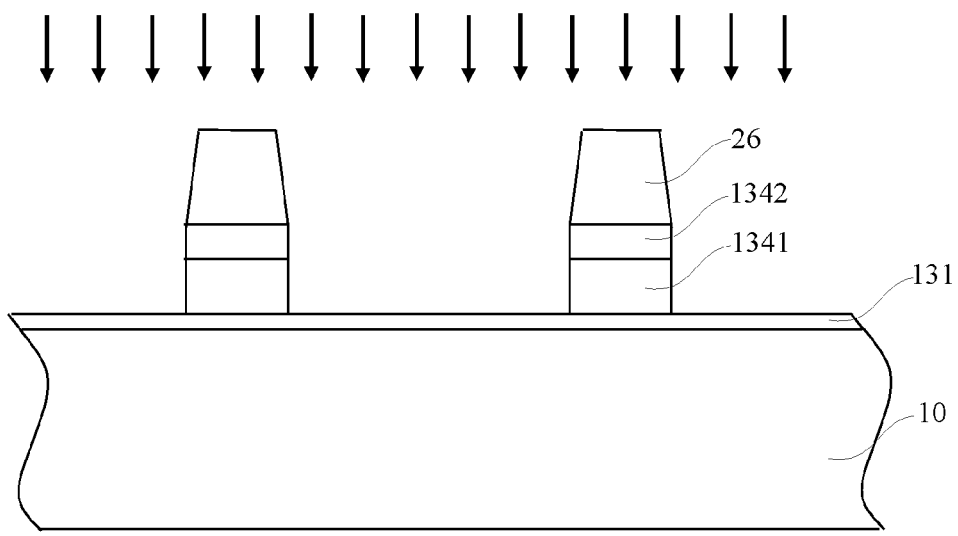

As an example, in operation 2-2), firstly a first patterned photoresist layer 26 is formed on the insulating layer 133, the first patterned photoresist layer 26 defines a position and a shape of the word line 13, as illustrated in FIG. 6 and FIG. 7, and then the insulating layer 133 and the first polycrystalline silicon layer 132 are sequentially etched according to the first patterned photoresist layer 26 to form the word line conductive layers 1341 and the top insulating layer 1342, as illustrated in FIG. 8; the insulating layer 133 and the first polycrystalline silicon layer 132 may be sequentially etched by adopting a dry etching process, a wet etching process or a combination of the dry etching process and the wet etching process, preferably the insulating layer 133 and the first polycrystalline silicon layer 132 are sequentially and anisotropically etched by adopting the dry etching process, and a vertically downward arrow in FIG. 8 expresses a direction of plasmas in a dry etching process; etching gas and related etching process conditions for etching the insulating layer 133 and the first polycrystalline silicon layer 132 are well-known by those skilled in the art and thus are not repetitively described herein.

As an example, in operation 2-3), a material of the sidewall spacer dielectric layer 1351 may include, but is not limited to, at least one of silicon oxide and silicon nitride; and a thickness of the sidewall spacer dielectric layer 1351 may be configured according to actual needs, preferably, in this embodiment, the thickness of the sidewall spacer dielectric layer 1351 may be in a range of 10 nm-40 nm.

As an example, in operation 2-4), part of the sidewall spacer dielectric layer 1351 between the stacked structures 134 and part of the first gate dielectric layer 131 may be removed through etching by adopting an etching process to form the stacked structure 134 comprising the bottom dielectric layer 1343, the word line conductive layers 1341 and the top insulating layer 1342 which are sequentially stacked from bottom to top, and the word line sidewall spacers 135 on both sides of the stacked structure 134. Preferably, the sidewall spacer dielectric layer 1351 and the first gate dielectric layer 131 are sequentially and anisotropically etched by adopting a dry etching process, a vertically downward arrow in FIG. 10 and FIG. 11 expresses a direction of plasmas in the dry etching process.

As an example, the word line 13 in the present embodiment is simultaneously used as a gate structure of a memory cell, i.e., the word line 13 comprises a word line gate structure. The word line 13 may be spaced in parallel.

As an example, an extending direction of the word line 13 is intersected with an extending direction of the active region 12, preferably, the extending direction of the word line 13 and the extending direction of the active region 12 have a first angle α, a numerical value range of the first angle α may be any value in a range of 0°-90°, preferably, in this embodiment, the first angle α is equal to 90°, i.e., the extending direction of the word line 13 is perpendicular to the extending direction of the active region 12.

It needs to be stated that the above-mentioned and below-mentioned "in a range of" refers to a numerical value range comprising two numerical value endpoints.

In operation 3), referring to operation S3 in FIG. 1 and FIG. 12 to FIG. 18, at least one source 14 and at least one drain 15 are formed in the semiconductor substrate 10, and a floating gate 16 is formed on a sidewall of the word line 13 on a side close to the source 14, the source 14 and the drain 15 are respectively located on two opposite sides of the word line, a cross section width of the floating gate 16 gradually decreases from a bottom portion to a top portion such that a portion of a top portion of the floating gate 16 that contacts with the word line 13 presents as a sharp tip edge.

Figure 12:
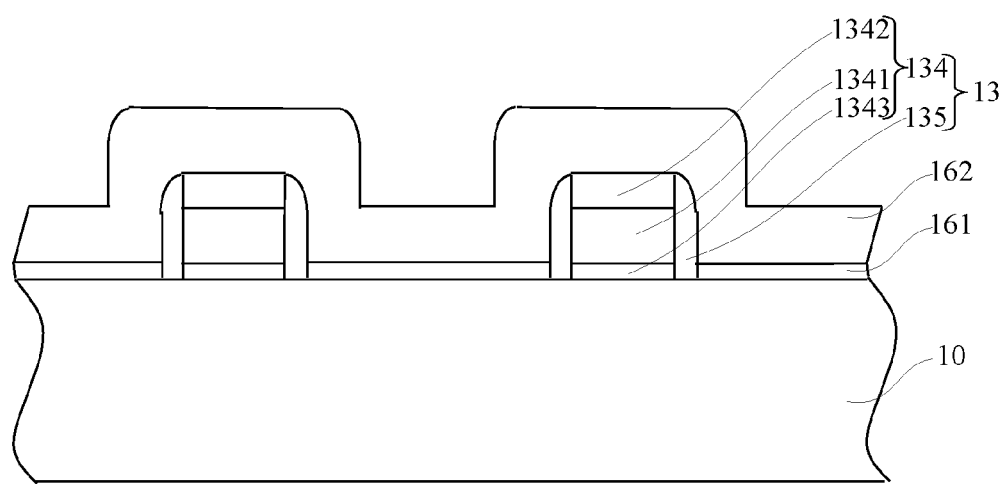
Figure 13:
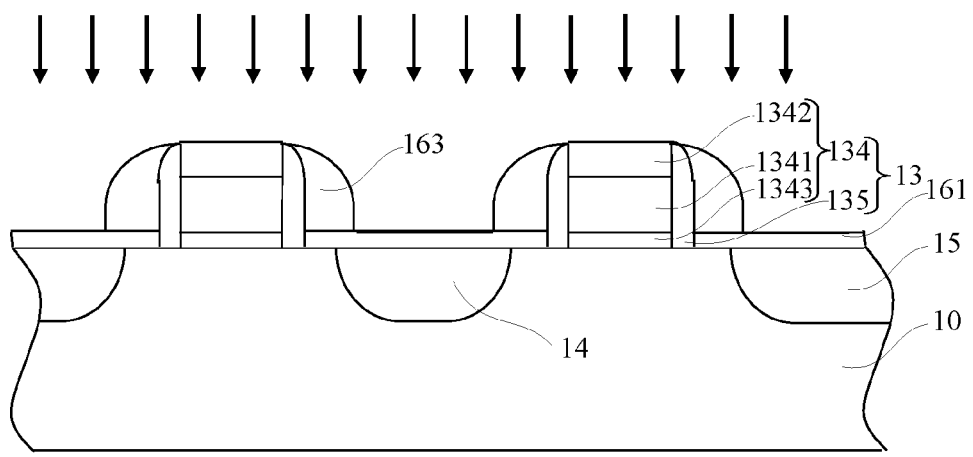
Figure 14:
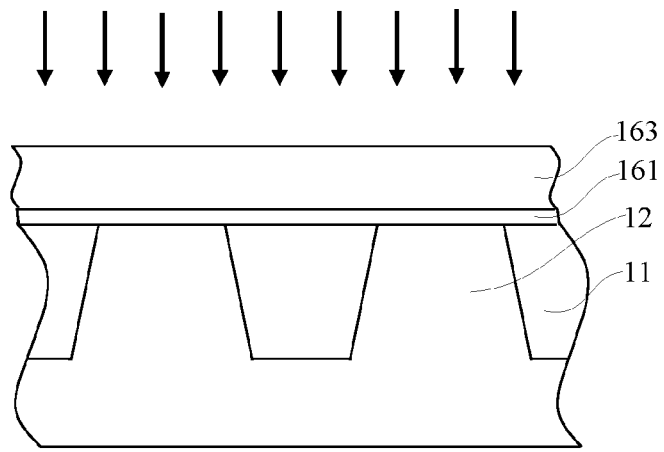

As an example, forming the source 14 and the drain 15 in the semiconductor substrate 10, and forming the floating gate 16 on a sidewall of the word line 13 on a side close to the source 14 specifically comprises the following:

3-1) forming a second gate dielectric layer 161 on a surface of the exposed semiconductor substrate 10;

3-2) forming a second polycrystalline silicon layer 162 on a surface of the structure obtained in operation 3-1), the second polycrystalline silicon layer 162 covers a surface of the second gate dielectric layer 161 and the sidewall and the upper surface of the word line 13, as illustrated in FIG. 12;

3-3) etching the second polycrystalline silicon layer 162 to form at least one polycrystalline silicon sidewall spacer 163 on outer walls of the word line sidewall spacers 135; preferably, anisotropically etching the second polycrystalline silicon layer 162 by adopting a dry etching process, an outer sidewall, away from the word line 13, of the polycrystalline silicon sidewall spacer 163 formed after etching presents an arc extending from bottom to top, i.e., the cross section width of the polycrystalline silicon sidewall spacer 163 gradually decreases from a bottom portion to a top portion such that the top portion of the polycrystalline silicon sidewall spacer 163 presents a sharp tip edge 166 in contact with the word line 13, as illustrated in FIG. 13;

3-4) performing ion implantation in the semiconductor substrate 10 according to the polycrystalline silicon sidewall spacer 163 to form the source 14 and the drain 15 in the semiconductor substrate 10, as illustrated in FIG. 14; and 3-5) removing the polycrystalline silicon sidewall spacer 163 and the second gate dielectric layer 161 on a side of the word line 13 close to the drain 15, and removing part of the polycrystalline silicon sidewall spacer 163 on a side of the word line 13 close to the source 14 and in a region above the shallow trench isolation structure 11, the reserved polycrystalline silicon sidewall spacer 163 and the reserved second gate dielectric layer 161 below the reserved polycrystalline silicon sidewall spacer 163 form the floating gate 16, as illustrated in FIG. 15 to FIG. 18; and specifically, the reserved polycrystalline silicon sidewall spacer 163 is used as a floating gate conductive layer 165, and the reserved second gate dielectric layer 161 below the floating gate conductive layer 165 is used as a floating gate dielectric layer 164.

As an example, in operation 3-1), a material of the second gate dielectric layer 161 may include, but is not limited to, silicon oxide, silicon oxynitride or the like; and a thickness of the second gate dielectric layer 161 may be configured according to actual needs, preferably, in this embodiment, the thickness of the second gate dielectric layer 161 may be in a range of 5 nm-12 nm.

As an example, in operation 3-2), the second polycrystalline silicon layer 162 may be a polycrystalline silicon layer of the second doping type, i.e., the doping type of the second polycrystalline silicon layer 162 is the same as the doping type of the first polycrystalline silicon layer 132 and is different from the doping type of the semiconductor substrate 10; a thickness of the second polycrystalline silicon layer 162 may be configured according to actual needs, preferably, in this embodiment, the thickness of the second polycrystalline silicon layer 162 may be in a range of 200 nm-500 nm.

As an example, in operation 3-4), implantation of ions of the second doping type is performed in the semiconductor substrate 10 to form the source 14 and the drain 15 of the second doping type; and the ions of the second doping type may include, but are not limited to, phosphorus (P) ions or arsenic (As) ions. Specific methods for performing ion implantation in the semiconductor substrate 10 to form the source 14 and the drain 15 are well-known by those skilled in the art and thus are not repetitively described herein. It needs to be stated that a vertically downward arrow in FIG. 13 expresses a direction of ion implantation.

Figure 15:
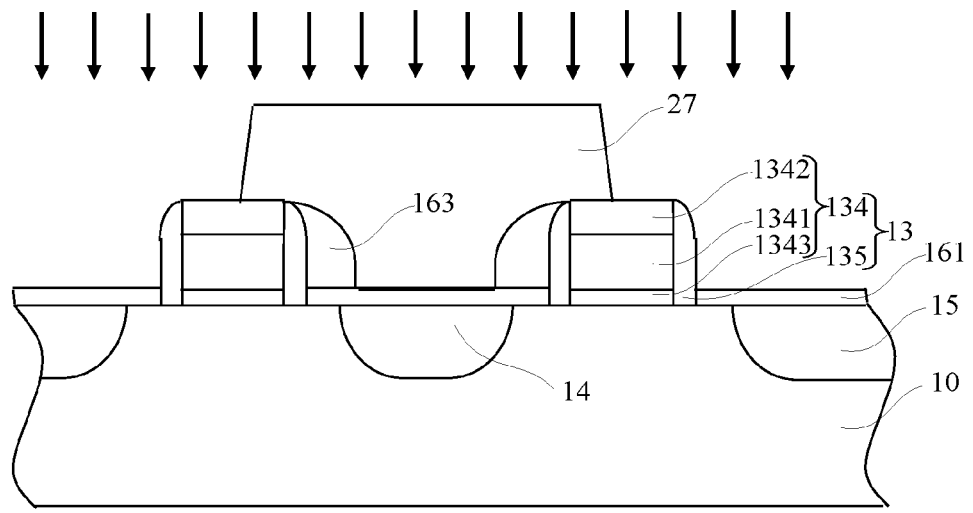
Figure 16:
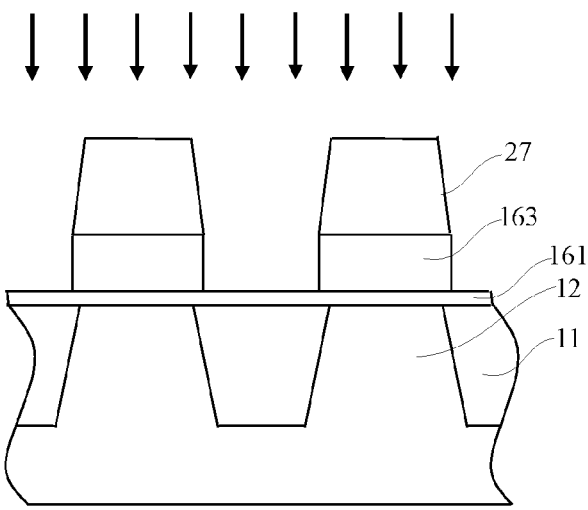
Figure 17:
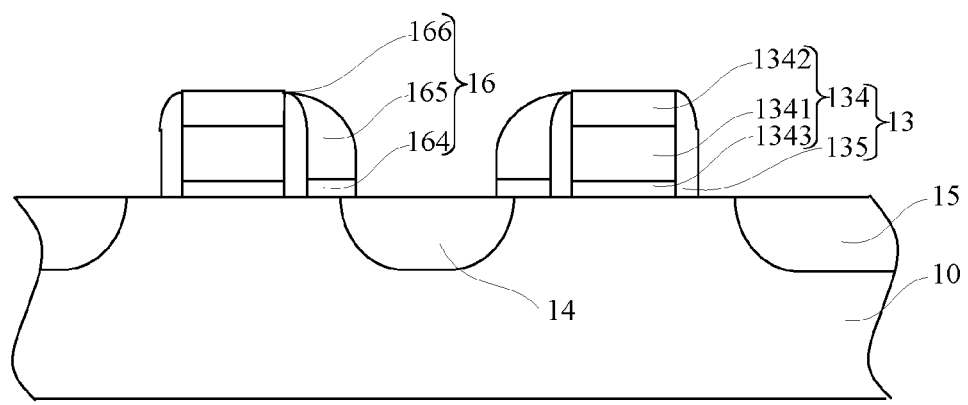
Figure 18:
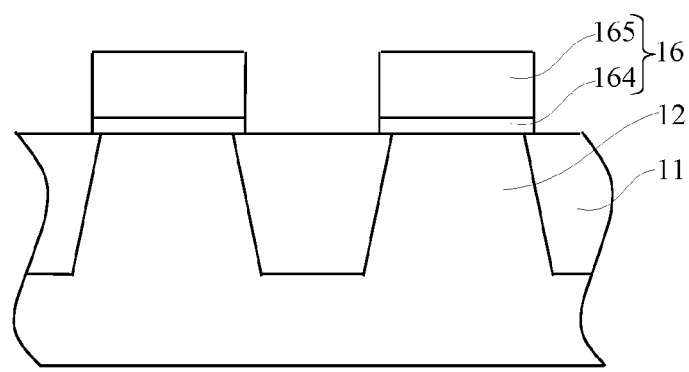

As an example, in operation 3-5), firstly, a second patterned photoresist layer 27 is formed on a surface of the structure obtained in operation 3-4), and the second patterned photoresist layer 27 at least covers the polycrystalline silicon sidewall spacer 163 and the second gate dielectric layer 161 which need to be reserved to form the floating gate 16, as illustrated in FIG. 15 and FIG. 16; secondly, the polycrystalline silicon sidewall spacer 163 on a side of the word line 13 close to the drain 15 is etched and removed, and part of the polycrystalline silicon sidewall spacer 163 on a side of the word line 13 close to the source 14 and in a region above the shallow trench isolation structure 11 is removed according to the second patterned photoresist layer 27, as illustrated in FIG. 15 and FIG. 16, specifically, the polycrystalline silicon sidewall spacer 163 is removed through anisotropic etching by adopting a dry etching process, wherein vertically downward arrows in FIG. 15 and FIG. 16 express directions of plasmas in the dry etching process; finally, the second patterned photoresist layer 27 is removed, and the exposed second gate dielectric layer 161 (the exposed second gate dielectric layer 161 comprises the second gate dielectric layer 161 above the drain 15 and the second gate dielectric layer 161 between the adjacent floating gates 13) is removed to obtain the floating gate 16, as illustrated in FIG. 17 to FIG. 18. It needs to be stated that the word line sidewall spacer 135 on a side close to the drain 15 is removed while the second gate dielectric layer 161 which needs to be removed is removed.

As an example, a length of the floating gate 16 may be configured according to actual needs, preferably, in this embodiment, the length of the floating gate 16 is greater than the width of the active region 12 and needs to guarantee that there is a distance between the two adjacent floating gates 16 such that electrical isolation is realized between the two floating gates.

Figure 19:
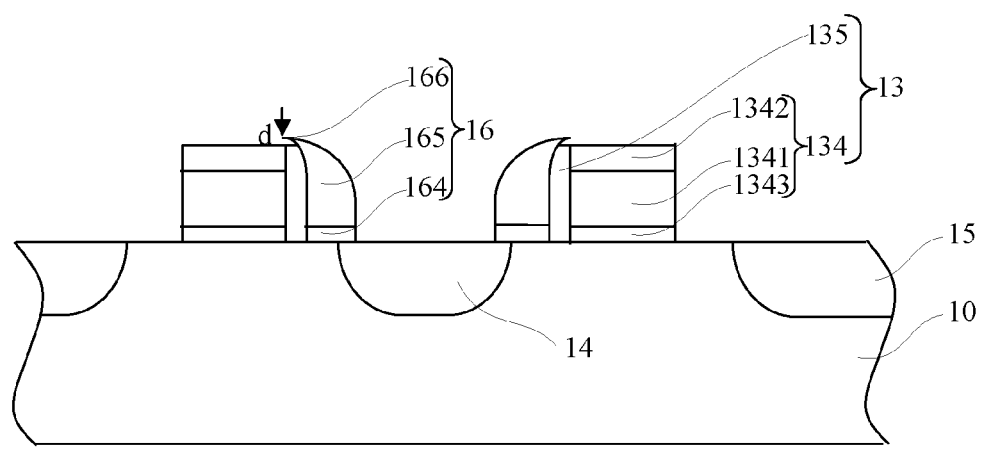
FIG. 19 illustrate a partial sectional structural schematic view of a structure obtained in operation 4) of the method for fabricating the split-gate non-volatile memory provided in embodiment 1 of the present disclosure.

In operation 4), referring to operation S4 in FIG. 1 and FIG. 19, part of the word line 13 is removed by adopting an etching process such that the sharp tip edge 166 of the top portion of the floating gate 16 is higher than the upper edge of the top surface of the word line 13.

As an example, the part which can be removed by adopting the wet etching process is specifically part of the top insulating layer 1342 in the word line 13. Since the material of the top insulating layer 1342 is preferably silicon oxide, in this embodiment, part of the top insulating layer 1342 may be removed by adopting hydrofluoric acid. Of course, in other examples, any one of wet etching solutions which can remove the top insulating layer 1342 without causing etching removal to the floating gate conductive layer 165 may also be adopted. In the wet etching process, temperature of the hydrofluoric acid, time of wet etching and the like are not specifically limited. In the present embodiment, after wet etching, it is only required that the sharp tip edge 166 of the top portion of the floating gate 16 is exposed, i.e., after wet etching, the sharp tip edge 166 of the top portion of the floating gate 16 is required to have a distance d to the upper surface of the reserved top insulating layer 1342; preferably, a thickness of the top insulating layer 1342 in the word line 13 formed by adopting the wet etching process is in a range of 10 nm-50 nm, i.e., after wet etching, the distance d between the sharp tip edge 166 of the top portion of the floating gate 16 and the upper surface of the reserved top insulating layer 1342 is in a range of 10 nm-50 nm; more preferably, in this embodiment, the thickness of the top insulating layer 1342 in the word line 13 formed by adopting the wet etching process may be 10 nm, 20 nm, 30 nm, 40 nm or 50 nm.

In other examples, part of the word line 13 may also be etched and removed by adopting any one of dry etching processes which can remove the top insulating layer 1342 without causing etching to the floating gate conductive layer 165, and part of the word line 13 may also be removed by adopting a wet etching and dry etching combined process, but it is required to guarantee that the top insulating layer 1342 is removed without causing etching to the floating gate conductive layer 165 at the same time.

It needs to be stated that this operation, regardless of adopting the wet etching process, the dry etching process or a combined process, is only for the purpose of removing part of the top insulating layer 1342 to release the sharp tip edge 166, and in the etching process, any processing is not performed to the floating gate 16 and the sharp tip edge 166.

In operation 5), referring to operation S5 in FIG. 1 and FIG. 20 to FIG. 24, a tunneling dielectric layer 17 and an erasing gate 18 are formed at the top portion of the floating gate 16, the tunneling dielectric layer 17 at least covers part of the sharp tip edge 166 of the top portion of the floating gate 16, and the erasing gate 18 is located on an upper surface of the tunneling dielectric layer 17; preferably, the tunneling dielectric layer 17 at least covers part of the upper surface of the word line 13.

As an example, forming the tunneling dielectric layer 17 and the erasing gate 18 at the top portion of the word line 13 and the top portion of the floating gate 16 specifically comprises the following:

5-1) forming a tunneling dielectric material layer 171 on a surface of the structure obtained in operation 4), wherein the tunneling dielectric material layer 171 covers the exposed semiconductor substrate 10, the word line 13 and the floating gate 16;

5-2) forming a third polycrystalline silicon layer 181 on the tunneling dielectric material layer 171; and 5-3) etching the third polycrystalline silicon layer 181 and the tunneling dielectric material layer 171 to form the tunneling dielectric layer 17 and the erasing gate 18, as illustrated in FIG. 20 to FIG. 24.

As an example, in operation 5-1), a material of the tunneling dielectric material layer 171 may include, but is not limited to, silicon oxide. Specifically, the tunneling dielectric material layer 171 may be formed by adopting a High Temperature Oxidation (HTO) and thermal oxidation combined process, and the formed tunneling dielectric material layer 171 is placed at an NO or $N_2O$ atmosphere to perform annealing treatment. A thickness of the tunneling dielectric material layer 171 may be configured according to actual needs; preferably, the thickness of the tunneling dielectric material layer 171 may be in a range of 8 nm-15 nm; more preferably, in the present embodiment, the thickness of the tunneling dielectric material layer 171 is 12 nm. Since the top portion of the floating gate 16 in the present disclosure is the sharp tip edge 166, due to the tip discharge effect, the FN (Fowler-Nordheim) tunneling effect between the floating gate 16 and the erasing gate 18 can be greatly improved, and thus on the premise that the performance of the split-gate non-volatile memory is guaranteed, the thickness of the tunneling dielectric material layer 171 can be notably increased (the thickness of the tunneling dielectric layer in the prior art is generally 7 nm-9 nm, while the thickness of the tunneling dielectric material layer 171 in the present application can reach 8 nm-15 nm). Since the material of the tunneling dielectric layer 17 between the floating gate 16 and the erasing gate 18 is generally silicon oxide or silicon nitride, but silicon oxide and silicon nitride cannot realize absolute insulation, current leakage is very easily caused if the thickness of the tunneling dielectric layer 17 is small, and thus the performance of the device is influenced. In the present application, by increasing the thickness of the tunneling dielectric material layer 171, occurrence of leakage current can be effectively avoided, the split-gate non-volatile memory is enabled to have better data retention and thus the performance of the split-gate non-volatile memory is improved.

As an example, in operation 5-2), the third polycrystalline silicon layer 181 may be a polycrystalline silicon layer of the second doping type, i.e., the doping type of the third polycrystalline silicon layer 181 is the same as the doping type of the second polycrystalline silicon layer 162 and the first polycrystalline silicon layer 132, and is different from the doping type of the semiconductor substrate 10; the second doping type may be P-type and may also be N-type; a thickness of the third polycrystalline silicon layer 181 may be configured according to actual needs, preferably, in the present embodiment, the thickness of the third polycrystalline silicon layer 181 may be in a range of 200 nm-500 nm.

Figure 20:
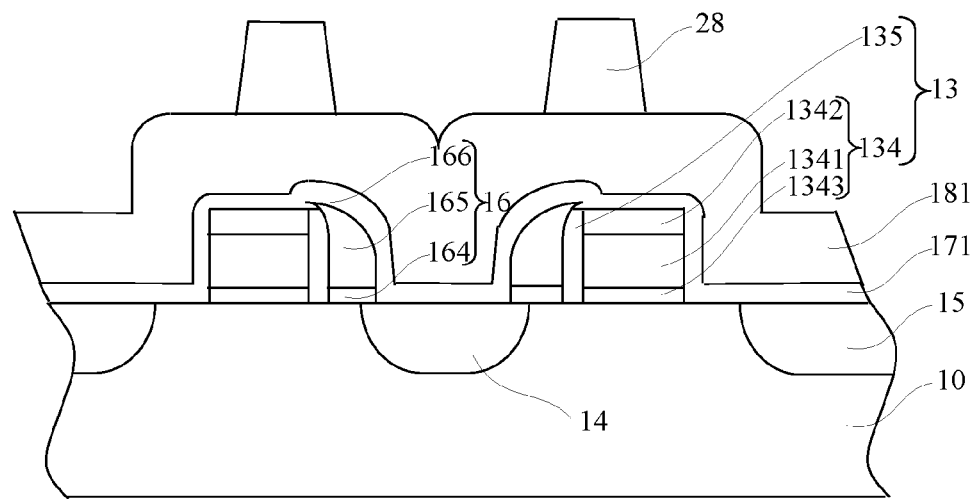
Figure 21:
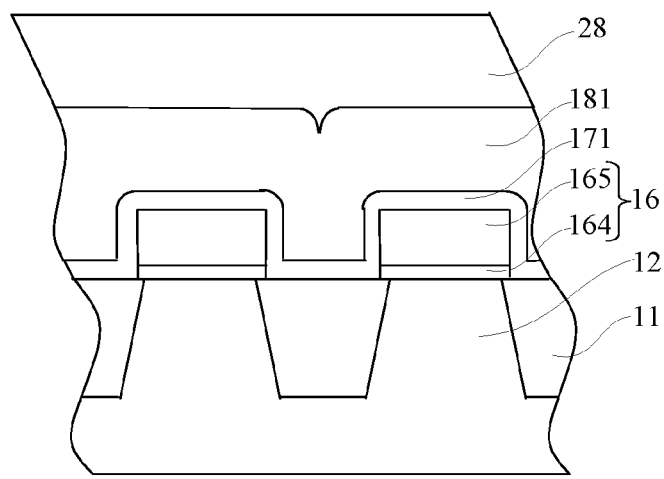
Figure 22:
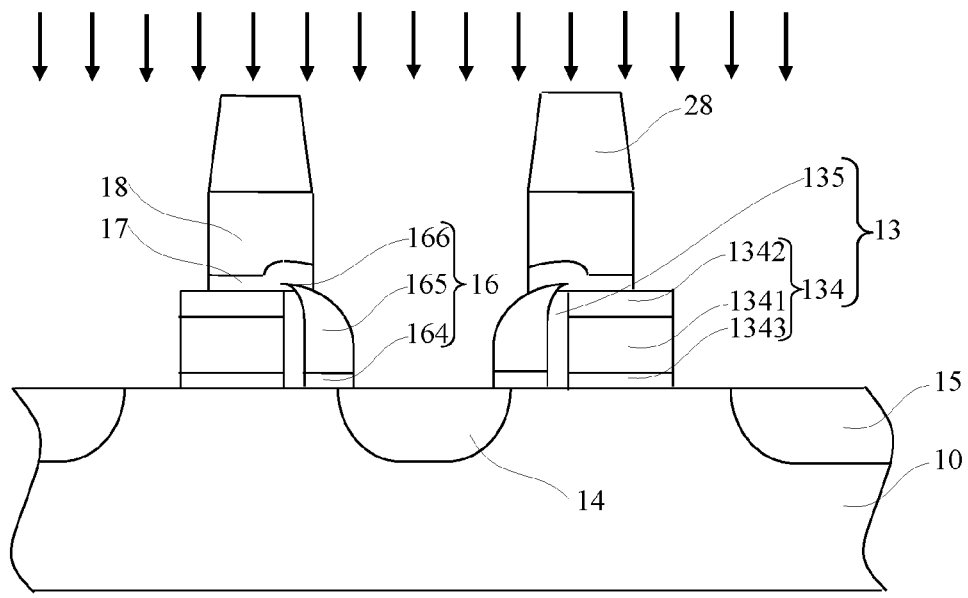
Figure 23:
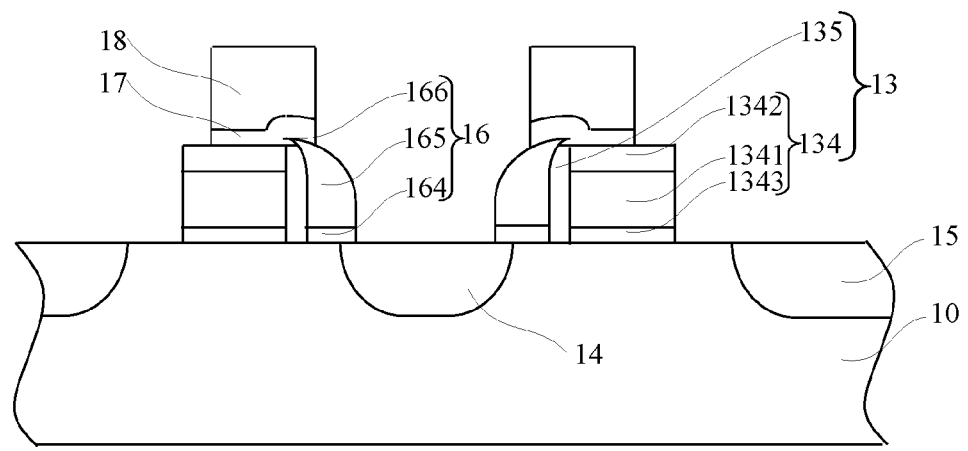
Figure 24:
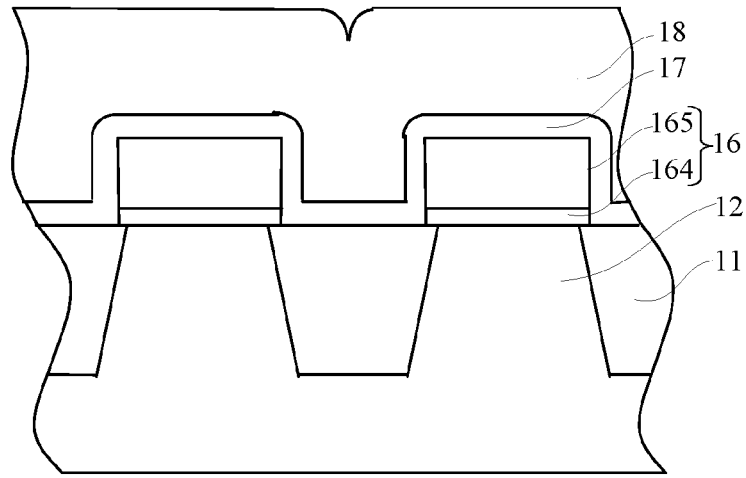

As an example, operation 5-3) specifically comprises the following: firstly a third patterned photoresist layer 28 is formed on an upper surface of the third polycrystalline silicon layer 181, the third patterned photoresist layer 28 defines positions and shapes of the erasing gate 18 and the tunneling dielectric layer 17, as illustrated in FIG. 20 to FIG. 21; secondly, the third polycrystalline silicon layer 181 and the tunneling dielectric material layer 17 are sequentially etched according to the third patterned photoresist layer 28, preferably, in the present embodiment, the third polycrystalline silicon layer 181 and the tunneling dielectric material layer 17 are sequentially and isotropically etched by adopting a dry etching process, as illustrated in FIG. 22, a vertically downward arrow in FIG. 22 expresses a direction of plasmas in the dry etching process; and then, the third patterned photoresist layer 28 is removed to obtain the tunneling dielectric layer 17 and the erasing gate 18, as illustrated in FIG. 23 to FIG. 24.

Figure 25:
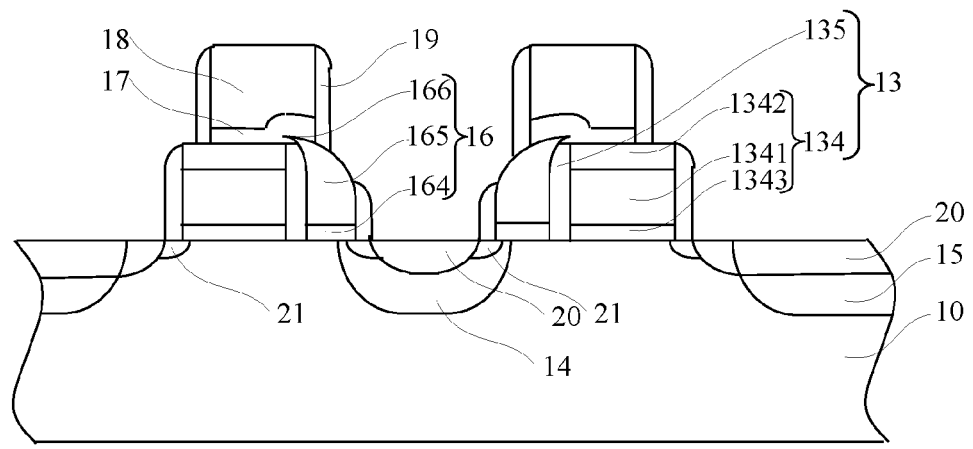
FIG. 25 illustrate a sectional structural schematic view of a structure obtained after forming a heavily doped region and a lightly doped diffusion region in the method for fabricating the split-gate non-volatile memory provided in embodiment 1 of the present disclosure.

As an example, in operation 5), after the tunneling dielectric layer 17 and the erasing gate 18 are formed, the method further comprises the following:

forming a sidewall spacer 19 on a sidewall of the erasing gate 18, a sidewall of the floating gate 16 and a sidewall of the stacked structure 134 close to the drain 15, specifically, a material of the sidewall spacer 19 may include, but is not limited to, at least one of silicon oxide and silicon nitride;

forming a heavily doped region 20 in the source 14 and the drain 15, and forming a lightly doped diffusion region 21 on a periphery of the heavily doped region 20, as illustrated in FIG. 25. The doping type of the heavily doped region 20 and the lightly doped diffusion region 21 may be the second doping type, i.e., the heavily doped region 20 and the lightly doped diffusion region 21 both are regions of the second doping type which is the same as the doping type of the first polycrystalline silicon layer 132, the second polycrystalline silicon layer 162 and the third polycrystalline silicon layer 181. It needs to be stated that the so-called "heavily doped" and "lightly doped" herein are relative concepts, i.e., it can be called "heavily doped" when a doping amount is significantly greater than the doping amount of the lightly doped diffusion region 21, and it can be called "lightly doped" when the doping amount is significantly smaller than the doping amount of the heavily doped region 20. Specific methods for forming the heavily doped region 20 and the lightly doped diffusion region 21 are well-known by those skilled in the art and thus are not repetitively described herein.

Figure 26:
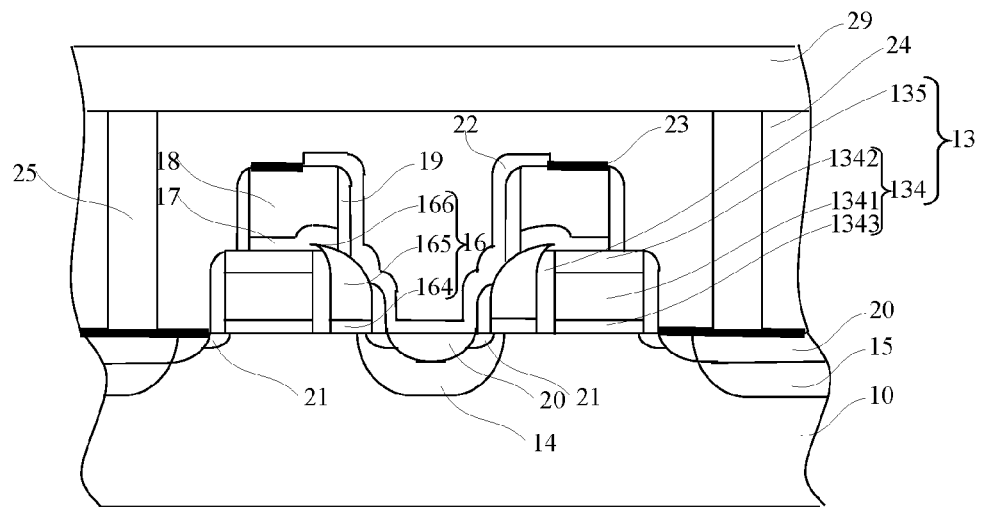

As an example, in operation 5), after the heavily doped region 20 and the lightly doped diffusion region 21 are formed, the method further comprises the following:

forming a silicide barrier layer 22 on part of an upper surface of the erasing gate 18, a surface of the sidewall spacer 19 of the erasing gate 18 on a side close to the source 14, a surface of the sidewall spacer 19 located on the sidewall of the floating gate 16 and an upper surface of the source 14, the silicide barrier layer 22 defines a position and a shape of a self-aligned silicide layer which is subsequently formed; and forming a self-aligned silicide layer 23 on an upper surface of the exposed erasing gate 16, and an upper surface of the drain 15, as illustrated in FIG. 26. A material of the self-aligned silicide layer 23 may comprise metal silicide such as tungsten silicide and so on, and the self-aligned silicide layer 23 is used for reducing a contact resistance that forms the device structure (such as the drain and the erasing gate) and the metal leading-out structure (such as the conductive plug).

Figure 27:
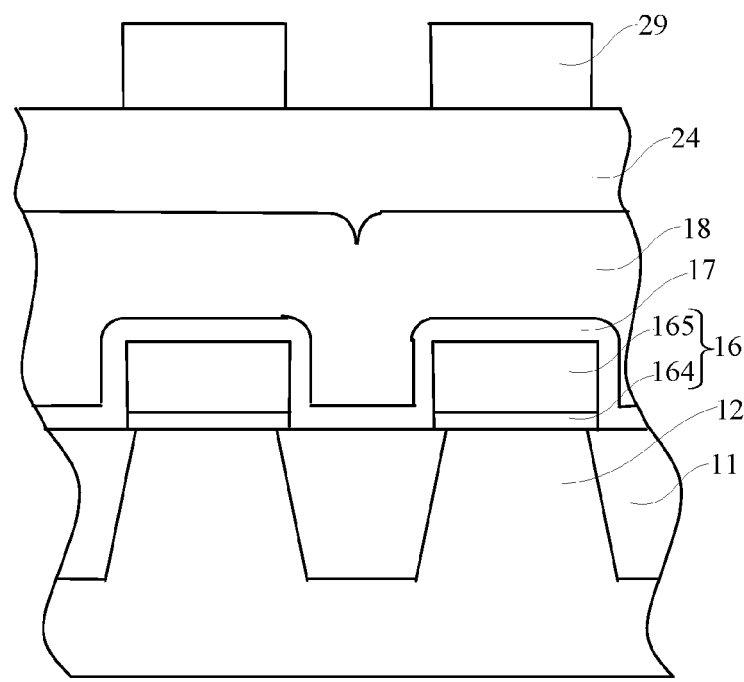

In operation 6), referring to operation S1 in FIG. 1 and FIG. 26 to FIG. 27, a conductive plug 25 is formed on the drain 15 and at least one spaced metal bit line 29 is formed on the conductive plug 25, the metal bit line 29 is electrically connected to the drain 15 through the conductive plug 25.

As an example, in operation 6), before the conductive plug 25 is formed, the method further comprises the following:

forming an interlayer dielectric layer 24 on a surface of the structure obtained in operation 5), a material of the interlayer dielectric layer 24 may include, but is not limited to, silicon oxide, silicon nitride or silicon oxynitride, an upper surface of the interlayer dielectric layer 24 is higher than the upper surface of the erasing gate 18 to guarantee that the interlayer dielectric layer 24 can fully cover the erasing gate 18, the word line 13 and the floating gate 16; and forming a connecting via (not shown) in the interlayer dielectric layer 24, the connecting via exposes the drain 14, specifically the connecting via may be formed by adopting a photolithographic etching process and the connecting via is used as a leading-out via of the drain 14.

As an example, a conductive material layer is filled into the connecting via to form the conductive plug 25; and the metal bit line 29 is formed on the interlayer dielectric layer 24. The conductive plug 25 may comprise a tungsten plug or a copper plug. The metal bit line 29 may be spaced in parallel.

As an example, an extending direction of the metal bit line 29 is intersected with an extending direction of the active region 12, preferably the extending direction of the metal bit line 29 and the extending direction of the active region 12 have a second angle, the second angle may be any numerical value in a range of 0°-90°, preferably, in the present embodiment, the second angle is 0°, i.e., the extending direction of the metal bit line 29 and the extending direction of the active region 12 are the same.

Embodiment 2

In combination with FIG. 2 to FIG. 25, continuously refer to FIG. 26 to FIG. 27, the present disclosure further provides a split-gate non-volatile memory. The split-gate non-volatile memory may be obtained by adopting, but not limited to, the method for fabricating the split-gate non-volatile memory in embodiment 1. The split-gate non-volatile memory at least comprises: a semiconductor substrate 10, at least one shallow trench isolation structure 11 is formed in the semiconductor substrate 10, the shallow trench isolation structure 11 isolates at least one spaced active region 12 in the semiconductor substrate 10; at least one spaced word line 13; a source 14; a drain 15, the source 14 and the drain 15 are respectively located on two opposite sides of the word line 13; a floating gate 16 located on a sidewall of the word line 13 close to the source 14, a cross section width of the floating gate 16 gradually decreases from a bottom portion to a top portion such that a top portion of the floating gate 16 presents as a sharp tip edge 166, the sharp tip edge 166 of the top portion of the floating gate 16 is higher than an upper edge of a top surface of the word line 13 and has a preset distance to the top surface of the word line 13; a tunneling dielectric layer 17, the tunneling dielectric layer 17 at least covers part of the sharp tip edge 166 of the top portion of the floating gate 16; an erasing gate 18 located on the tunneling dielectric layer 17; a conductive plug 25 located on the drain 15 and electrically connected to the drain 15; at least one spaced metal bit line 29 located on the conductive plug 25 and electrically connected to the drain 15 through the conductive plug 25.

As an example, a material of the semiconductor substrate 10 may include, but is not limited to, a monocrystalline or polycrystalline semiconductor material, the semiconductor substrate 10 may further comprise an intrinsic monocrystalline silicon substrate or doped silicon substrate; preferably, the semiconductor substrate 10 comprises a substrate of a first doping type, the first doping type may be P-type and may also be N-type, in this embodiment the situation that the first doping type is P-type is taken as an example, i.e., in the present embodiment, the situation that the semiconductor substrate 10 is a P-type substrate is only taken as an example.

As an example, the shallow trench isolation structure 11 may be formed by forming trenches (not shown) in the semiconductor substrate 10 and then filling an isolation material into the trenches. A material of the shallow trench isolation structure 11 may comprise silicon nitride, silicon oxide, silicon oxynitride or the like, preferably, in the present embodiment, the material of the shallow trench isolation structure 11 comprises silicon oxide. A shape of a cross section of the shallow trench isolation structure 11 may be configured according to actual needs, FIG. 4 takes the situation that the shape of the cross section of the shallow trench isolation structure 11 comprises an inverted trapezoid shape as an example; of course, in other examples, the shape of the cross section of the shallow trench isolation structure 11 may also be a U shape, etc.

It needs to be stated that, the specific number of the active region 12 isolated by the shallow trench isolation structure 11 in the semiconductor substrate 10 may be configured according to actual needs and is not limited herein. FIG. 3 takes the situation that two said active regions 12 in the semiconductor substrate 10 are only illustrated as an example.

It needs to be further stated that the active region 12 may be spaced in parallel and may also be freely arranged according to actual needs.

As an example, the word line 13 comprise a stacked structure 134 and word line sidewall spacers 135 on both sides of the stacked structure 134, wherein the stacked structure 134 comprises a bottom dielectric layer 1343, a word line conductive layer 1341 and a top insulating layer 1342 which are sequentially stacked from bottom to top.

As an example, a material of the bottom dielectric layer 1343 may include, but is not limited to, silicon oxide, silicon oxynitride or the like, a thickness of the bottom dielectric layer 1343 may be configured according to actual needs, preferably, in the present embodiment, the thickness of the bottom dielectric layer 1343 may be in a range of 2 nm-18 nm; a material of the word line conductive layer 1341 may comprise polycrystalline silicon of a second doping type, i.e., the doping type of the word line conductive layer 1341 is different form the doping type of the semiconductor substrate 10, the second doping type may be P-type and may also be N-type, when the first doping type is P-type, the second doping type is N-type, when the first doping type is N-type, the second doping type is P-type, a thickness of the word line conductive layer 1341 may be configured according to actual needs, preferably, in the present embodiment, the thickness of the word line conductive layer 1341 may be in a range of 200 nm-500 nm; a material of the top insulating layer 1342 may include, but is not limited to, silicon oxide or silicon nitride, a thickness of the top insulating layer 1342 may be configured according to actual needs, preferably, in the present embodiment, the thickness of the top insulating layer 1342 may be in a range of 50 nm-200 nm.

As an example, a material of the word line sidewall spacer 135 may include, but is not limited to, at least one of silicon oxide and silicon nitride; a thickness of the word line sidewall spacer 135 may be configured according to actual needs, preferably, in the present embodiment, the thickness of the word line sidewall spacer 135 may be in a range of 10 nm-40 nm.

As an example, the word line 13 in the present embodiment is simultaneously used as a gate structure of a memory cell, i.e., the word line 13 comprises a word line gate structure. The word line 13 may be spaced in parallel.

As an example, an extending direction of the word line 13 is intersected with an extending direction of the active region 12, preferably the extending direction of the word line 13 and the extending direction of the active region 12 have a first angle α, a numerical value range of the first angle α may be in a range of 0°-90°, and preferably, in the present embodiment, the first angle α is equal to 90°, i.e., the extending direction of the word line 13 is perpendicular to the extending direction of the active region 12.

It needs to be stated that the above-mentioned and subsequent "in a range of" refers to a numerical value range comprising two numerical value endpoints.

As an example, the floating gate 16 comprises a floating gate dielectric layer 164 and a floating gate conductive layer 165, wherein the floating gate dielectric layer 164 is located on the semiconductor substrate 10 and the floating gate conductive layer 165 is located on the floating gate dielectric layer 164.

As an example, a material of the floating gate dielectric layer 164 may include, but is not limited to, silicon oxide, silicon oxynitride or the like; a thickness of the floating gate dielectric layer 164 may be configured according to actual needs, preferably, in the present embodiment, the thickness of the floating gate dielectric layer 164 may be in a range of 5 nm-12 nm; a material of the floating gate conductive layer 165 may comprise polycrystalline silicon of the second doping type, i.e., the doping type of the floating gate conductive layer 165 is the same as the doping type of the word line conductive layer 134 and is different from the doping type of the semiconductor substrate 10; a thickness of the floating gate conductive layer 165 may be configured according to actual needs, preferably, in the present embodiment, the thickness of the floating gate conductive layer 165 may be in a range of 200 nm-500 nm.

As an example, the source 14 and the drain 15 both are regions of the second doping type, the source 14 and the drain 14 are doped with phosphorus ions or arsenic ions.

As an example, a length of the floating gate 16 may be configured according to actual needs, preferably, in the present embodiment, the length of the floating gate 16 is greater than the width of the active region 12 and needs to guarantee that there is a distance between two adjacent floating gates 16 such that electrical isolation is realized between the two adjacent floating gates.

As an example, the distance d between the sharp tip edge 166 of the top portion of the floating gate 16 and the upper surface of the reserved top insulating layer 1342 is in a range of 10 nm-50 nm; preferably, in the present embodiment, the distance d between the sharp tip edge 166 of the top portion of the floating gate 16 and the upper surface of the reserved top insulating layer 1342 may comprise 10 nm, 20 nm, 30 nm, 40 nm or 50 nm.

As an example, a material of the tunneling dielectric layer 17 may include, but is not limited to, silicon oxide, a thickness of the tunneling dielectric layer 17 may be configured according to actual needs; preferably, the thickness of the tunneling dielectric layer 17 may be in a range of 8 nm-15 nm, more preferably, in the present embodiment, the thickness of the tunneling dielectric layer 17 is 12 nm. Since the top portion of the floating gate 16 in the present disclosure is the sharp tip edge 166, due to the tip discharge effect, the FN (Fowler-Nordheim) tunneling effect between the floating gate 16 and the erasing gate 18 can be greatly improved, and thus on the premise that the performance of the split-gate non-volatile memory is guaranteed, the thickness of the tunneling dielectric layer 17 can be notably increased (the thickness of the tunneling dielectric layer in the prior art is generally 7 nm-9 nm, while the thickness of the tunneling dielectric layer 17 in the present application can reach 8 nm-15 nm). Since the material of the tunneling dielectric layer 17 between the floating gate 16 and the erasing gate 18 is generally silicon oxide or silicon nitride, but silicon oxide and silicon nitride cannot realize absolute insulation, small thickness of the tunneling dielectric layer 17 easily causes current leakage, thus influencing the performance of the device. In the present application, by increasing the thickness of the tunneling dielectric layer 17, occurrence of leakage current can be effectively avoided, the split-gate non-volatile memory is enabled to have better data retention and thus the performance of the split-gate non-volatile memory is improved.

As an example, the tunneling dielectric layer 17 at least covers part of the upper surface of the word line 13.

As an example, a material of the erasing gate 18 may comprise polycrystalline silicon of the second doping type, a thickness of the erasing gate 18 may be configured according to actual needs, preferably, in the present embodiment, the thickness of the erasing gate 18 may be in a range of 200 nm-500 nm.

As an example, the split-gate non-volatile memory further comprises a sidewall spacer 19, the sidewall spacer 19 is located on a sidewall of the tunneling dielectric layer 17, a sidewall of the erasing gate 18 and a sidewall of the floating gate 16. A material of the sidewall spacer 19 may include, but is not limited to, at least one of silicon oxide and silicon nitride.

As an example, the split-gate non-volatile memory further comprises a heavily doped region 20 and a lightly doped diffusion region 21, the heavily doped region 20 is located in the source 14 and the drain 15, the heavily doped region 19 in the drain 15 extends to an outer side of the drain 15, and the lightly doped diffusion region 20 is located on a periphery of the heavily doped region 19. The doping type of the heavily doped region 20 and the lightly doped diffusion region 21 may be the second doping type, i.e., the heavily doped region 20 and the lightly doped diffusion region 21 both are regions of the second doping type. It needs to be stated that the so-called "heavily doped" and "lightly doped" herein are relative concepts, i.e., it can be called "heavily doped" when a doping amount is significantly greater than the doping amount of the lightly doped region 21, and it can be called "lightly doped" when a doping amount is significantly smaller than the doping amount of the heavily doped region 20.

As an example, the split-gate non-volatile memory further comprises: a silicide barrier layer 22 located on part of an upper surface of the erasing gate 18, a surface of the sidewall spacer 19 of the erasing gate 18 on a side close to the source 14, a surface of the sidewall spacer 19 located on the sidewall of the floating gate 16 and an upper surface of the source 14, the silicide barrier layer 22 defines a shape and a position of the self-aligned silicide layer 23; and a self-aligned silicide layer 23 located on an upper surface of the exposed erasing gate 18, and an upper surface of the drain 15, the conductive plug 25 is located on the self-aligned silicide layer 23 on the upper surface of the drain 15; a material of the self-aligned silicide layer 23 may comprise metal silicide such as tungsten silicide and so on, and the self-aligned silicide layer 23 is used for reducing a contact resistance that forms the device structure (such as the drain and the erasing gate) and the metal leading-out structure (such as the conductive plug).

As an example, the split-gate non-volatile memory further comprises an interlayer dielectric layer 24, the interlayer dielectric layer 24 covers the surface of the semiconductor substrate 10 and covers the word line 13, the floating gate 16 and the erasing gate 18; the conductive plug 25 is located in the interlayer dielectric layer 24 and the metal bit line 29 is located on the interlayer dielectric layer 24. A material of the interlayer dielectric layer 24 may include, but is not limited to, silicon oxide, silicon nitride or silicon oxynitride, and an upper surface of the interlayer dielectric layer 24 is higher than the upper surface of the erasing gate 18.

As an example, the conductive plug 25 may comprise a tungsten plug or a copper plug. The metal bit line 29 may be spaced in parallel.

As an example, an extending direction of the metal bit line 29 is intersected with an extending direction of the active region 12, preferably the extending direction of the metal bit line 29 and the extending direction of the active region 12 have a second angle, the second angle may be any numerical value in a range of 0°-90°, preferably, in the present embodiment, the second angle is 0°, i.e., the extending direction of the metal bit line 29 and the extending direction of the active region 12 are the same.

In the present disclosure, the word line 13, the floating gate 16 on one side of the word line 13, the erasing gate 18 above the word line 13 and the floating gate 16, and the source 14 and the drain 15 on both sides of the word line 13 jointly form a memory cell, the split-gate non-volatile memory provided by the present disclosure comprises a plurality of memory cells, the plurality of memory cells are arranged in a multi-line multi-row array, the drains 15 of all memory cells in the same row are sequentially connected in series through one said metal bit line 29, the word lines 13 of all memory cells in the same line are sequentially connected in series, the erasing gates 18 of all memory cells in the same line are sequentially connected in series, and the sources of all memory cells in two adjacent lines are sequentially connected in series to form a source line 141.

Figure 28:
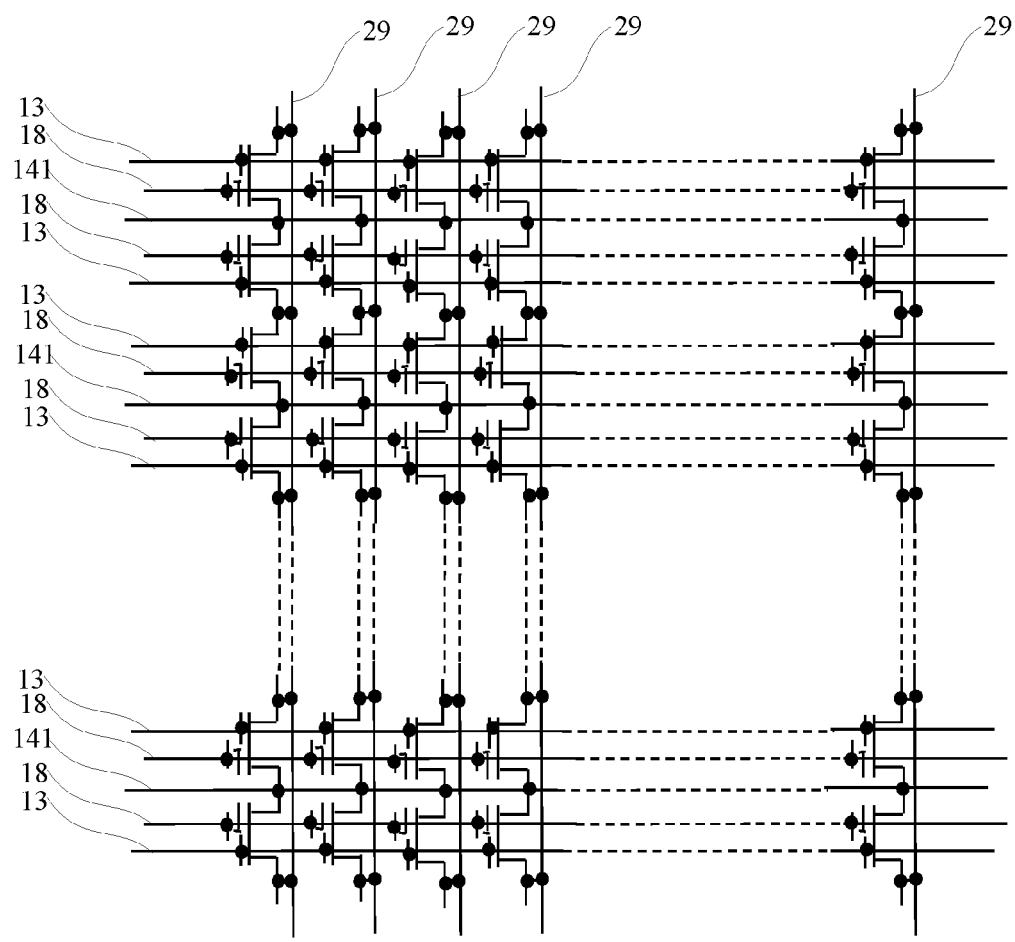
FIG. 28 illustrates an equivalent circuit diagram of the split-gate non-volatile memory provided by the present disclosure.

An equivalent circuit diagram of the split-gate non-volatile memory provided by the present disclosure is as illustrated in FIG. 28. From FIG. 28, it can be seen that the split-gate non-volatile memory comprises a plurality of memory transistors arranged in multiple lines and multiple rows, a plurality of metal bit lines 29 spaced in parallel, a plurality of word lines 13 spaced in parallel and a plurality of source lines 141 spaced in parallel, wherein the word lines 13 are connected to the gates of all memory transistors in the same line, the erasing gates 18 of all memory transistors in the same line are sequentially connected in series, the source lines 141 are connected to the sources 14 of all memory transistors in the same line, and the metal bit lines 29 are connected to the drains 15 of all memory transistors in the same row.

Figure 29:
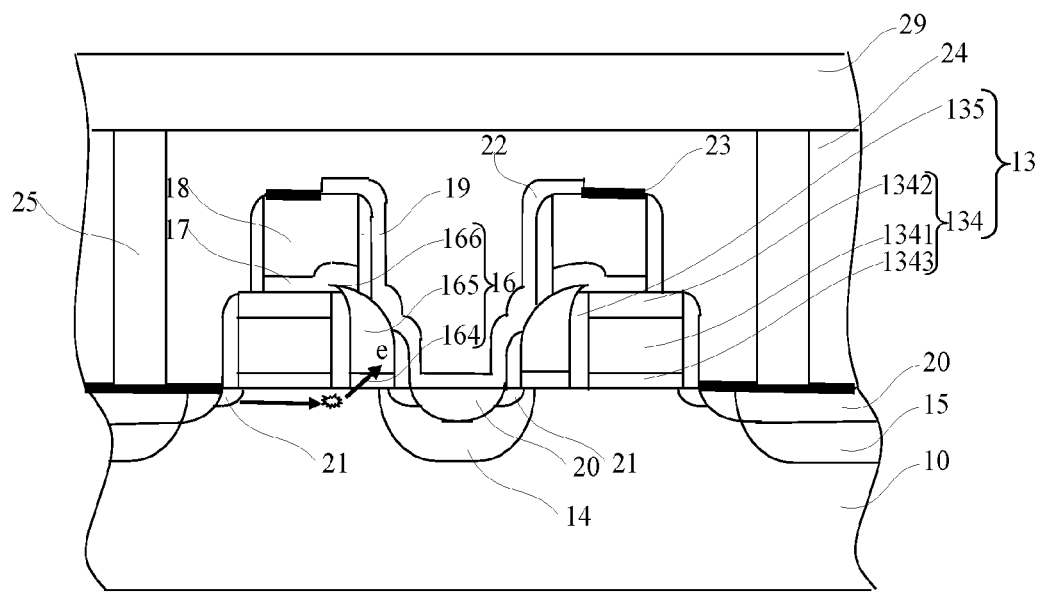
FIG. 29 and FIG. 30 illustrate schematic diagrams of the split-gate non-volatile memory operation functions provided by the present disclosure.
Figure 30:
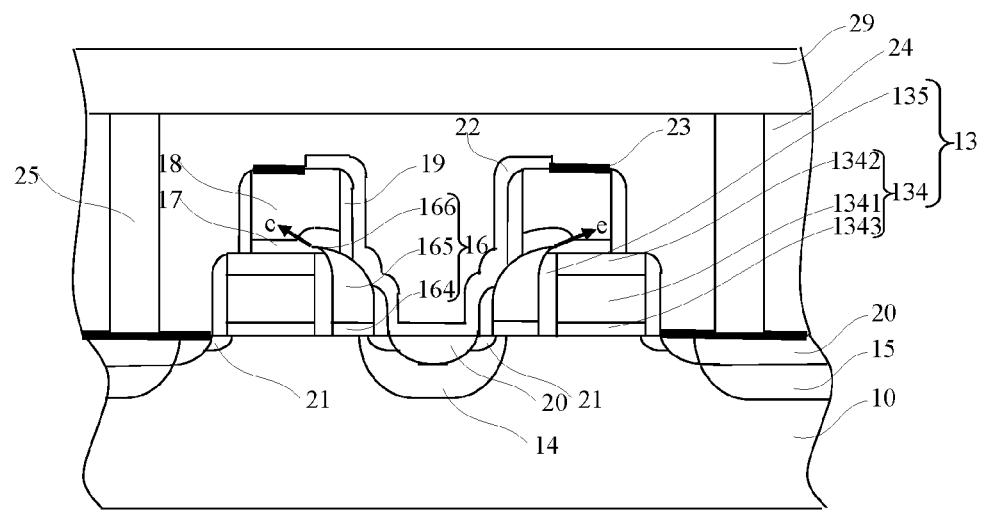

Please refer to FIG. 29 and FIG. 30, during programming, taking a situation that a memory unit on a left side in FIG. 29 is selected and a memory unit on a right side in FIG. 29 is not selected as an example, the working principle of the split-gate non-volatile memory provided by the present disclosure is as follow: during programming, as illustrated in FIG. 29, charges are injected into the floating gate conductive layer 165 in the floating gate 16 from the channels formed at the bottom portion of the word lines 13 by means of hot electron injection to realize storing, arrows in FIG. 29 express a moving direction of charges, and reference sign "e" in FIG. 29 expresses charges; and during erasing, as illustrated in FIG. 30, charges stored in the floating gate conductive layer 165 penetrate through the tunneling dielectric layer 17 by means of FN tunneling to enter the erasing gate 18 to realize erasing, arrows in FIG. 30 express a moving direction of charges and a reference sign "e" in FIG. 30 expresses charges.

To sum up, the present disclosure provides a split-gate non-volatile memory and a fabrication method thereof. The method for fabricating the split-gate non-volatile memory comprises: 1) preparing a semiconductor substrate and forming at least one shallow trench isolation structure in the semiconductor substrate, the shallow trench isolation structure isolates at least one spaced active region in the semiconductor substrate; 2) forming at least one spaced word line on the semiconductor substrate; 3) forming a source and a drain in the semiconductor substrate, and forming at least one floating gate on a sidewall of the word line on a side close to the source, the source and the drain are respectively located on two opposite sides of the word line, a cross section width of the floating gate gradually decreases from a bottom portion to a top portion such that a portion of the top portion of the floating gate that contacts with the word line presents as a sharp tip edge; 4) removing part of the word line by adopting a wet etching process such that the sharp tip edge of the top portion of the floating gate is higher than an upper edge of a top surface of the word line; 5) forming a tunneling dielectric layer and an erasing gate at the top portion of the floating gate, the tunneling dielectric layer at least covers part of the sharp tip edge of the top portion of the floating gate, and the erasing gate is located on an upper surface of the tunneling dielectric layer; and 6) forming at least one conductive plug on the drain and forming at least one metal bit line on the conductive plug, the metal bit line is electrically connected to the drain through the conductive plug. By designing the top portion of the floating gate to be the sharp tip edge, the FN tunneling effect between the floating gate and the erasing gate can be notably increased; since the top portion of the floating gate is the sharp tip edge, the thickness of the tunneling dielectric layer between the erasing gate and the floating gate can be increased, thus occurrence of leakage current is avoided and the split-gate non-volatile memory can have better data retention.

The above-mentioned embodiments are just used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

What is claimed is:

1. A method for fabricating a split-gate non-volatile memory, comprising:
   1) preparing a semiconductor substrate by forming at least one shallow trench isolation structure in the semiconductor substrate, wherein the shallow trench isolation structure isolates at least one spaced active region in the semiconductor substrate;
   2) forming at least one spaced word line on the semiconductor substrate;
   3) forming at least one source and at least one drain in the semiconductor substrate, and forming at least one floating gate on a sidewall of the word line on a side close to the source, wherein the source and the drain are respectively located on two opposite sides of the word line, a width of the floating gate gradually decreases from a bottom portion to a top portion, such that a portion of the top portion of the floating gate that contacts with the word line presents as a sharp tip edge;
   4) removing part of the word line by adopting an etching process, such that the sharp tip edge of the top portion of the floating gate is higher than an upper edge of a top surface of the word line;
   5) forming a tunneling dielectric layer and an erasing gate at the top portion of the floating gate, wherein the tunneling dielectric layer at least covers the sharp tip edge of the top portion of the floating gate, and the erasing gate is located on an upper surface of the tunneling dielectric layer; and
   6) forming at least one conductive plug on the at least one drain and forming at least one spaced metal bit line on the conductive plug, wherein the metal bit line is electrically connected to the at least one drain through the conductive plug.

2. The method for fabricating the split-gate non-volatile memory according to claim 1, wherein in operation 5), the tunneling dielectric layer at least covers part of an upper surface of the word lines.

3. The method for fabricating the split-gate non-volatile memory according to claim 1, wherein in operation 4), the thickness of the word line formed by the etching process is in a range of 10 nm-50 nm.

4. The method for fabricating the split-gate non-volatile memory according to claim 1, wherein the operation 2) comprises the following:
   2-1) sequentially forming a first gate dielectric layer, a first polycrystalline silicon layer and an insulating layer which are stacked from bottom to top on the semi conductor substrate;
   2-2) etching the insulating layer and the first polycrystalline silicon layer to form a plurality of spaced word line conductive layers and a top insulating layer located on an upper surface of the word line conductive layers;
   2-3) forming a sidewall spacer dielectric layer on the exposed first gate dielectric layer, sidewalls of the word line conductive layers, and a sidewall and an upper surface of the top insulating layer; and
   2-4) etching the sidewall spacer dielectric layer and the first gate dielectric layer to form a stacked structure comprising a bottom dielectric layer, the word line conductive layers and the top insulating layer which are sequentially stacked from bottom to top, and word line sidewall spacers located on both sides of the stacked structure.

5. The method for fabricating the split-gate non-volatile memory according to claim 1, wherein operation 3) comprises the following:
   3-1) forming a second gate dielectric layer on a surface of the exposed semiconductor substrate;
   3-2) forming a second polycrystalline silicon layer on a surface of the structure obtained in operation 3-1), the second polycrystalline silicon layer covers a surface of the second gate dielectric layer and the sidewall and the upper surface of the word line;
   3-3) etching the second polycrystalline silicon layer to form at least one polycrystalline silicon sidewall spacer on outer walls of the word line sidewall spacers;
   3-4) performing ion implantation in the semiconductor substrate to form the source and the drain in the semiconductor substrate; and
   3-5) removing the polycrystalline silicon sidewall spacer of the word line and the second gate dielectric layer on a side close to the drain, and removing part of the polycrystalline silicon sidewall spacer of the word line on a side close to the source and in a region above the shallow trench isolation structure, the reserved polycrystalline silicon sidewall spacer and the reserved second gate dielectric layer below the reserved polycrystalline silicon sidewall spacer form the floating gate.

6. The method for fabricating the split-gate non-volatile memory according to claim 5, wherein after operation 3-5), further comprising the following:

removing the second gate dielectric layer above the drain, and the word line sidewall spacers on a side close to the drain.

7. The method for fabricating the split-gate non-volatile memory according to claim 1, wherein in operation 5), after the tunneling dielectric layer and the erasing gate are formed, the method further comprises the following:

forming a sidewall spacer on a sidewall of the erasing gate, a sidewall of the floating gate and a sidewall of the stacked structure close to the drain; and forming a heavily doped region in the source and the drain according to the sidewall spacer, and forming a lightly doped diffusion region on a periphery of the heavily doped region; wherein the semiconductor substrate comprises a substrate of a first doping type, the first polycrystalline silicon layer comprises a polycrystalline silicone layer of a second doping type, the second polycrystalline silicon layer comprises a polycrystalline silicon layer of the second doping type, the source and the drain both are regions of the second doping type, the erasing gate comprises a polycrystalline silicon layer of the second doping type, the heavily doped region and the lightly doped diffusion region both are regions of the second doping type; and the first doping type is different from the second doping type.

8. The method for fabricating the split-gate non-volatile memory according to claim 7, wherein in operation 5), after the heavily doped region and the lightly doped diffusion region are formed, the method further comprises the following:

forming a silicide barrier layer on part of an upper surface of the erasing gate, a surface of the sidewall spacer of the erasing gate on a side close to the source, a surface of the sidewall spacer located on the sidewall of the floating gate and an upper surface of the source; and forming a self-aligned silicide layer on an upper surface of the exposed erasing gate and an upper surface of the drain.

9. The method for fabricating the split-gate non-volatile memory according to claim 1, wherein operation 5) comprises the following:

5-1) forming a tunneling dielectric material layer on a surface of the structure obtained in operation 4), wherein the tunneling dielectric material layer covers the exposed semiconductor substrate, the word line and the floating gate;

5-2) forming a third polycrystalline silicon layer on the tunneling dielectric material layer; and 5-3) etching the third polycrystalline silicon layer and the tunneling dielectric material layer to form the tunneling dielectric layer and the erasing gate.

10. The method for fabricating the split-gate non-volatile memory according to claim 1, wherein in operation 6), before the conductive plug is formed, the method further comprises the following:

forming an interlayer dielectric layer on a surface of the structure obtained in operation 5), wherein the metal bit line is formed on the interlayer dielectric layer; and forming a connecting via in the interlayer dielectric layer, wherein the connecting via exposes the drain, a conductive material layer is filled into the connecting via to form the conductive plug.

* * * * *